(12) United States Patent
Yeom et al.

(10) Patent No.: US 9,202,774 B2
(45) Date of Patent: Dec. 1, 2015

(54) SEMICONDUCTOR DEVICE WITH AIR GAP AND METHOD FOR FABRICATING THE SAME

(71) Applicant: SK hynix Inc., Gyeonggi-do (KR)

(72) Inventors: Seung-Jin Yeom, Gyeonggi-do (KR);
Sung-Won Lim, Gyeonggi-do (KR);
Seung-Hee Hong, Gyeonggi-do (KR);
Hyo-Seok Lee, Gyeonggi-do (KR);
Nam-Yeal Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/106,787

(22) Filed: Dec. 15, 2013

(65) Prior Publication Data

US 2015/0035050 A1 Feb. 5, 2015

(30) Foreign Application Priority Data

Jul. 31, 2013 (KR) ........................ 10-2013-0091075

(51) Int. Cl.
*H01L 23/498* (2006.01)
*H01L 23/48* (2006.01)

(52) U.S. Cl.
CPC ......... *H01L 23/48* (2013.01); *H01L 2924/0002* (2013.01)

(58) Field of Classification Search
CPC ..................................................... H01L 23/498
USPC ............................................................ 257/774
See application file for complete search history.

(56) References Cited

U.S. PATENT DOCUMENTS

| 2012/0091518 | A1 | 4/2012 | Sukekawa | |
|---|---|---|---|---|
| 2013/0049091 | A1 | 2/2013 | Saino | |
| 2013/0292847 | A1* | 11/2013 | Choi et al. | 257/774 |

FOREIGN PATENT DOCUMENTS

| KR | 1020110119047 | 11/2011 |
|---|---|---|
| KR | 101164972 | 7/2012 |
| KR | 1020130022872 | 3/2013 |

* cited by examiner

*Primary Examiner* — Marc Armand
(74) *Attorney, Agent, or Firm* — IP & T Group LLP

(57) ABSTRACT

A semiconductor device includes a plurality of first conductive structures formed over a substrate, second conductive structures each formed between neighboring first conductive structures of the first conductive structures, air gaps each formed between the second conductive structures and the neighboring first conductive structures thereof, third conductive structures each capping a portion of the air gaps, and capping structures each capping the other portion of the air gaps.

19 Claims, 29 Drawing Sheets

SEMICONDUCTOR DEVICE WITH AIR GAP AND METHOD FOR FABRICATING THE SAME

CROSS-REFERENCE TO RELATED APPLICATIONS

The present application claims priority of Korean Patent Application No. 10-2013-0091075, filed on Jul. 31 2013, which is incorporated herein by reference in its entirety.

BACKGROUND

1. Field

Exemplary embodiments of the present invention relate to a semiconductor device, and more particularly, to a semiconductor device including air gaps and a method for fabricating the semiconductor device.

2. Description of the Related Art

Semiconductor devices generally include a dielectric material interposed between neighboring conductive structures. As semiconductor devices are highly integrated, the distance between conductive structures becomes narrow, thus increasing parasitic capacitance. The increase in the parasitic capacitance deteriorates performance of a semiconductor device.

Among the methods for decreasing the parasitic capacitance is a method of reducing the dielectric constant of a dielectric material. However since the dielectric material has a high dielectric constant, there is a limitation in decreasing the parasitic capacitance.

SUMMARY

Exemplary embodiments of the present invention are directed to a semiconductor device that may have decreased parasitic capacitance between neighboring conductive structures, and a method for fabricating the semiconductor device.

In accordance with an embodiment of the present invention, a semiconductor device includes a plurality of first conductive structures formed over a substrate, one or more second conductive structures each formed between neighboring first conductive structures of the first conductive structures, one or more air gaps each formed between the second conductive structures and the neighboring first conductive structures thereof, one or more third conductive structures each capping a portion of the air gaps, and one or more capping structures each capping the other portion of the air gaps.

In accordance with another embodiment of the present invention, a semiconductor device includes an isolation structure formed over a substrate and including one or more openings, one or more first conductive structures each formed in the opening on the substrate, one or more air gaps each formed between a sidewall of the first conductive structure and a sidewall of the opening, one or more second conductive structures each capping a portion of the air gaps and one or more capping structures each capping the other portion of the air gap.

In accordance with a further embodiment of the present invention, a method for fabricating a semiconductor device includes forming an isolation layer over a substrate, forming an opening by etching the isolation layer, forming a preliminary first conductive structure which includes a first conductive structure formed inside the opening and a sacrificial spacer formed between a sidewall of the first conductive structure and a sidewall of the opening, forming a second conductive structure which covers a portion of the first conductive structure and a portion of the sacrificial spacer, forming an air gap by removing the sacrificial spacer, and forming a capping structure for capping a portion of the air gap.

In accordance with a still further embodiment of the present invention, a method for fabricating a semiconductor device includes forming a plurality of first conductive structures over a substrate, forming an isolation layer between the first conductive structures, forming one or more openings by etching the isolation layer, forming one or more preliminary second conductive structures in the respective openings, wherein the preliminary second conductive structure includes a second conductive structure formed inside the opening and a sacrificial spacer formed between a sidewall of the second conductive structure and a sidewall of the opening, forming one or more third conductive structures over the respective preliminary second conductive structures, herein the third conductive structure covers a portion of the second conductive structure and a portion of the sacrificial spacer, forming one or more air gaps by removing the respective sacrificial spacers, and forming one or more capping structures for capping respective the air gaps. According to an embodiment of the present invention, the parasitic capacitance may be decreased by forming the air gap between conductive structures.

According to an embodiment of the present invention, since the air gap is capped with a conductive structure and a capping structure, the air gap may be stably protected in the subsequent process.

According to an embodiment of the present invention, since an ohmic contact layer is formed in a wide area, contact resistance may be decreased.

According to an embodiment of the present invention, the resistance of a conductive structure may be decreased by increasing the volume of a metal-containing material included in the conductive structure.

DETAILED DESCRIPTION

Figure 1A:
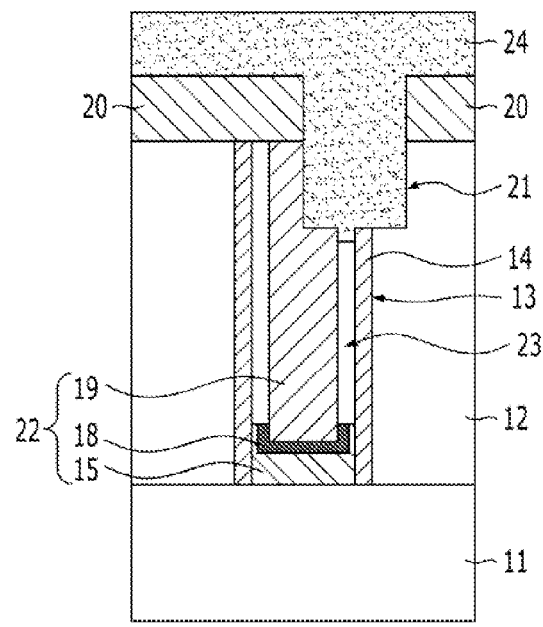
FIG. 1A is a cross-sectional view illustrating a semiconductor device in accordance with a first embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 1B:
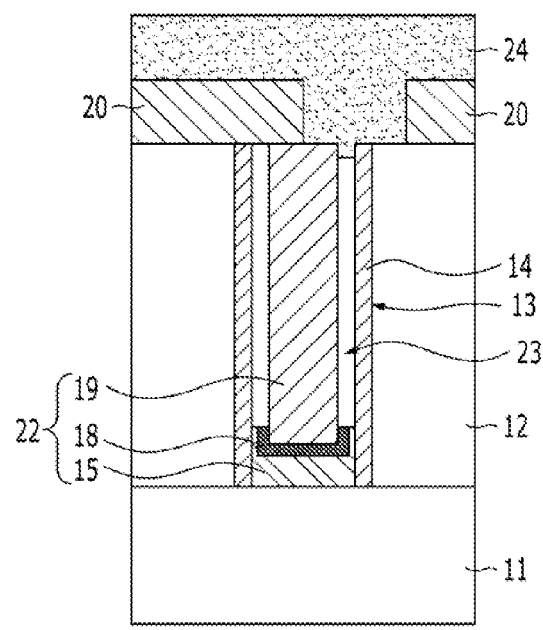
FIG. 1B is a cross-sectional view illustrating a semiconductor device in accordance with a modified example of the first embodiment of the present invention.
Figure 1C:
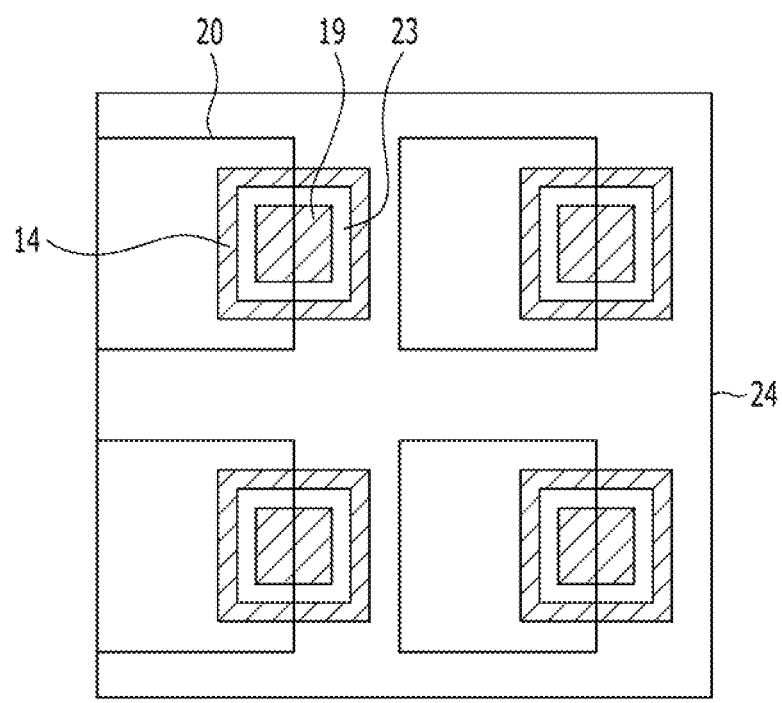
FIG. 1C is a plan view illustrating the semiconductor device in accordance with the first embodiment of the present invention and the modified example thereof.

FIG. 1A is a cross-sectional view illustrating a semiconductor device in accordance with a first embodiment of the present invention. FIG. 1B is a cross-sectional view illustrating a semiconductor device in accordance with a modified example of the first embodiment of the present invention. FIG. 1C is a plan view illustrating the semiconductor device in accordance with the first embodiment of the present invention and the modified example thereof.

Referring to FIG. 1A, an insulation layer 12 is formed over a substrate 11 and then openings 13 are formed in the insulation layer 12. The openings 13 expose the surface of the substrate 11. A first conductive structure 22 is formed in each opening 13. An air gap 23 is formed between sidewalls of the first conductive structure 22 and sidewalls of the opening 13. A second conductive structure 20 for capping a portion of the air gap 23 is formed, and a capping structure 24 is formed for capping the other portion of the air gap 23, which is not capped by the second conductive structure 20.

The substrate 11 includes a semiconductor substrate. To be specific, the substrate 11 may be a silicon substrate, a silicon germanium substrate, or a Silicon On Insulator (SOI) substrate. The insulation layer 12 includes a dielectric material. Specifically, the insulation layer 12 includes a low-k dielectric material. The insulation layer 12 may be a silicon nitride layer or a silicon oxide layer. The insulation layer 12 may be an inter-layer dielectric (ILD) layer.

The openings 13 may have a hole shape or a line shape. For example, the openings 13 may be defined as contact holes, vias, through-holes, trenches, or recesses. When the opening 13 is a contact hole, the first conductive structure 22 is a plug.

The first conductive structure 22 includes a first conductive pattern 15, a second conductive pattern 18, and a third conductive pattern 19. The first conductive pattern 15 is formed by being recessed in the opening 13. The second conductive pattern 18 is formed over the first conductive pattern 15, and the third conductive pattern 19 is formed over the second conductive pattern 18. The first conductive pattern 15 occupies less volume than the third conductive pattern 19 in the first conductive structure 22. The air gap 23 is formed between the sidewalls of the third conductive pattern 19 and the sidewalls of opening 13. The first conductive pattern 15 includes a silicon-containing layer. The first conductive pattern 15 may include polysilicon. The polysilicon may be doped with an impurity. The second conductive pattern 18 and the third conductive pattern 19 include a metal-containing layer. As an example, the second conductive pattern 18 includes a metal silicide, and the third conductive pattern 19 includes a metal layer. The second conductive pattern 18 functions as an ohmic contact layer between the first conductive pattern 15 and the third conductive pattern 19. The second conductive pattern 18 may include a cobalt silicide. The cobalt silicide may be of a "$CoSi_2$" phase. The third conductive pattern 19 may include tungsten. The first conductive structure 22 has a stacked structure where a polysilicon layer, a cobalt silicide layer, and a tungsten layer are stacked. Since the volume of the third conductive pattern 19 is greater than that of the first conductive pattern 15, the third conductive pattern 19 is dominant in determining the resistance of the first conductive structure 22. Therefore, the resistance of the first conductive structure 22 is drastically decreased by the third conductive pattern 19 that includes a metal component. The air gap 23 is formed between the sidewalls of the third conductive pattern 19 and the sidewalls of the opening 13.

The air gap 23 may be formed as a sacrificial material is removed. After the first conductive pattern 15 and the second conductive pattern 18 are formed, a sacrificial layer is formed on the sidewalls of the opening 13. Subsequently, the sacrificial layer is removed after the third conductive pattern 19 is formed. This will be described later. A spacer 14 is further formed on the sidewalls of the opening 13.

The second conductive structure 20 overlaps with a portion of the first conductive structure 22 and caps a portion of the air gap 23. The second conductive structure 20 may be extended to the upper surface of the insulation layer 12. The second conductive structure 20 includes a metal-containing layer. The second conductive structure 20 may include a tungsten layer.

The capping structure 24 covers the upper portion of the second conductive structure 20 and caps the rest of the air gap 23, which is not capped by the second conductive structure 20. The capping structure 24 includes a dielectric material. The capping structure 24 includes a silicon nitride or a silicon oxide. The capping structure 24 may include a silicon nitride produced through a Plasma Enhanced Chemical Vapor Deposition (PECVD) method. Since the air gap 23 has a narrow entrance, i.e., width, the air gap 23 may be capped without being filled.

A recess 21 is formed to be self-aligned to the edge of the second conductive structure 20 and formed by recessing a portion of the first conductive structure 22 and a portion of the air gap 23. The recess 21 may be formed by recessing a portion of the insulation layer 12. The capping structure 24 gap-fills the recess 21.

Since the capping structure 24 is formed on the recess 21, the air gap 23 is capped with a depth of the recess 21 in a subsequent process.

The air gap 23 included in the semiconductor device in accordance with the first embodiment of the present invention is formed between the third conductive pattern 19 and the insulation layer 12.

Referring to FIG. 1B, the air gap 23 is capped with the capping structure 24 and the second conductive structure 20 without the recess 21.

Referring to FIG. 1C, the air gap 23 is capped with the second conductive structure 20 and the capping structure 24. A portion of the air gap 23 is capped with the second conductive structure 20, and the other portion of the air gap 23 is capped with the capping structure 24.

In accordance with the first embodiment of the present invention and a modified example of the first embodiment, the first conductive structure 22 may be a plug. The second conductive structure 20 may be a plug or a line layer. The first conductive structure 22 and the second conductive structure 20 may form a multi-layer plug. The first conductive structure 22 and the second conductive structure 20 may be a plug for coupling a transistor with a memory element. The first conductive structure 22 and the second conductive structure 20 may be a plug for coupling a transistor with a metal line. Additionally, the first conductive structure 22 may be a line layer, and the second conductive structure 20 may be a plug. Herein, the line layer includes bit lines, metal lines, gate electrodes, word lines, or penetrating electrodes. Although not illustrated in the drawing, a third conductive structure may be further formed over the second conductive structure 20. The third conductive structure may be a portion of the memory element that is electrically connected to the second conductive structure 20. The memory element may include a capacitor that is formed of a storage node, a dielectric layer, and a plate node, and the third conductive structure may include a storage node. The memory element may be realized in diverse shapes. For example, the memory element may include a variable resistive material. The memory element may have a stacked structure where a first electrode, a variable resistive material, and a second electrode are sequentially stacked, and the third conductive structure may include the first electrode electrically connected to the second conductive structure 20. A data may be stored and identified depending on the resistance of the variable resistive material which is changed according to the voltage applied to the first electrode and the second electrode. The variable resistive material may include a phase-changing material or a magnetic tunneling junction.

FIGS. 2A to 2L are cross-sectional views describing a method for fabricating the semiconductor device in accordance with the first embodiment of the present invention.

Figure 2A:
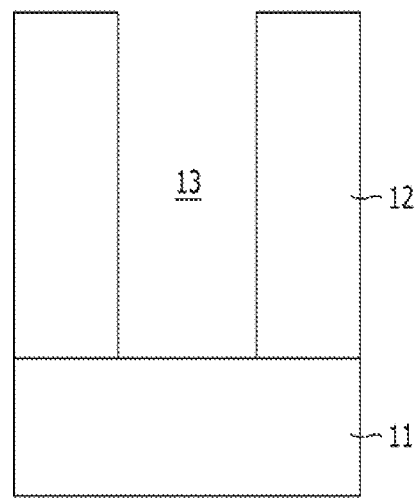
FIGS. 2A to 2L are cross-sectional views describing a method for fabricating the semiconductor device in accordance with the first embodiment of the present invention.

Referring to FIG. 2A, an insulation layer 12 is formed over a substrate 11. The substrate 11 includes a semiconductor substrate. Specifically, the substrate 11 contains silicon. The substrate 11 includes a silicon substrate, a silicon germanium substrate, or a Silicon On Insulator (SOI) substrate. The insulation layer 12 includes a low-k dielectric material. The insulation layer 12 may be a silicon nitride layer or a silicon oxide layer.

Subsequently, an opening 13 is formed in the insulation layer 12. The opening 13 is formed to expose the surface of the substrate 11 by etching the insulation layer 12. The opening 13 may have a hole shape or a line shape. The opening 13 may be defined as a contact hole, via, through-hole, trench, or recess. An opening array may be formed, as a plurality of openings 13 are regularly disposed with a predetermined gap between them. A mask pattern (not shown) may be used to etch the insulation layer 12. The mask pattern may include a photoresist pattern or a hard mask pattern patterned by using the photoresist pattern.

Figure 2B:
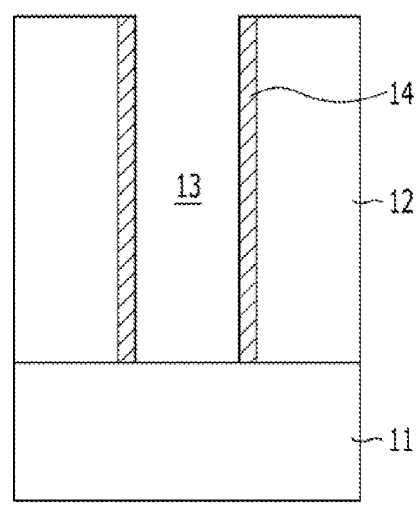

Referring to FIG. 2B, a spacer 14 is formed on the sidewalls of each opening 13. The spacer 14 is formed by forming an insulation layer (not shown) including the opening 13 and performing an etch-back process. The spacer 14 includes a low-k dielectric material. The spacer 14 may include a silicon nitride. As the spacer 14 is formed, the surface of the substrate 11 under the opening 13 is exposed. According to another embodiment of the present invention, the spacer 14 may be omitted.

Figure 2C:
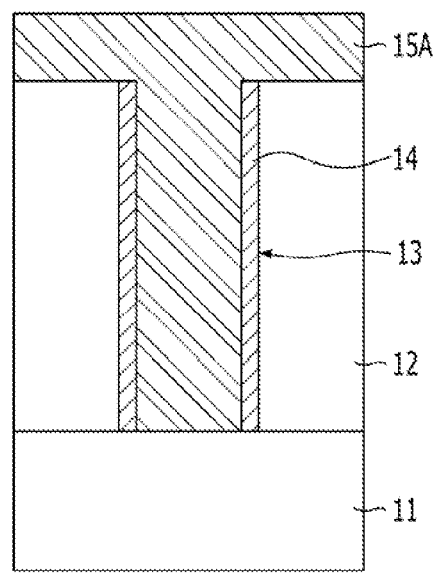

Referring to FIG. 2C, a first conductive layer 15A is formed. The first conductive layer 15A is formed over the insulation layer 12 including the spacer 14 to fill the opening 13. The first conductive layer 15A includes a silicidable material. The first conductive layer 15A may include a silicon-containing layer. The first conductive layer 15A may include polysilicon, which may be doped with an impurity. The first conductive layer 15A is in contact with the surface of the substrate 11.

Figure 2D:
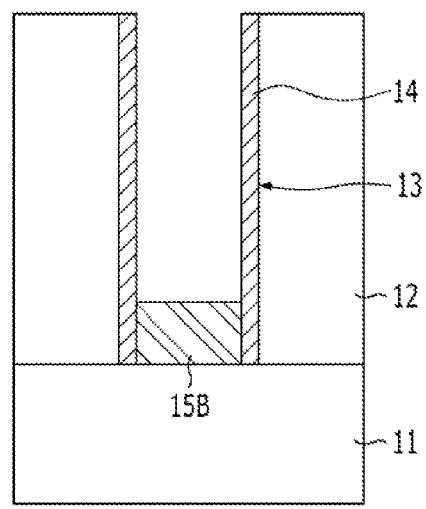

Referring to FIG. 2D, a first conductive pattern 15B is formed. The first conductive layer 15A shown in FIG. 2C is recessed in the opening 13 to form the first conductive pattern 15B. The first conductive pattern 15б may also be formed by performing an etch-back process on the first conductive layer 15A shown in FIG. 2C. The first conductive pattern 15B has a surface recessed lower than the upper surface of the insulation layer 12. The height of the first conductive pattern 15B may be adjusted to be as low as possible to minimize its share of the total volume of a conductive structure. Therefore, the resistance of the conductive structure may be decreased.

Figure 2E:
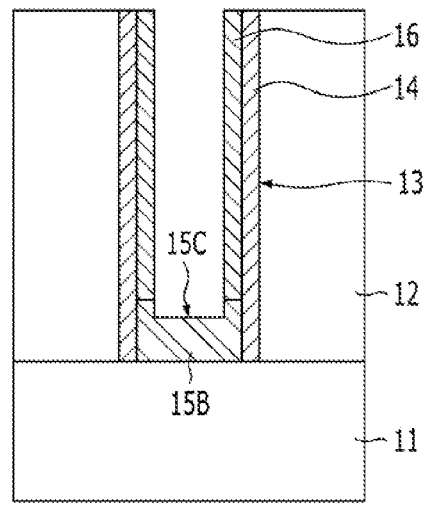

Referring to FIG. 2E, a sacrificial spacer 16 is formed. The sacrificial spacer 16 is formed on the sidewalls of the opening 13 over the first conductive pattern 15б. The sacrificial spacer 16 may be formed by selectively etching a sacrificial layer (not shown). A dry etch process may be used to form the sacrificial spacer 16. For example, the dry etch process may include an etch-back process. Through the etch process of forming the sacrificial spacer 16, the upper surface of the first conductive pattern 15B and the upper surface of the insulation layer 12 may be exposed. The sacrificial spacer 16 is removed in the subsequent process to form an air gap. The sacrificial spacer 16 may include a material having an etch selectivity to the insulation layer 12. The sacrificial spacer 16 may include a dielectric material. The sacrificial spacer 16 may include a material different from the materials of the insulation layer 12 and the spacer 14. For example, when the spacer 14 includes a silicon nitride, the sacrificial spacer 16 may include a silicon oxide. The sacrificial spacer 16 may also be formed by stacking a silicon oxide and a silicon nitride. The deposition of a silicon nitride and an etch-back process may be performed after the upper surface of the first conductive pattern 15B is exposed by depositing a silicon oxide and performing an etch-back process. Therefore, the spacer 14 and the sacrificial spacer 16 may have a structure of NO (Nitride-Oxide) or NON (Nitride-Oxide-Nitride).

When the sacrificial spacer 16 is formed or after the sacrificial spacer 16 is formed, the surface of the first conductive pattern 15B may be recessed to a predetermined depth (refer to reference numeral "15C"). This is to increase the reaction area for forming a silicide layer in the subsequent process.

Figure 2F:
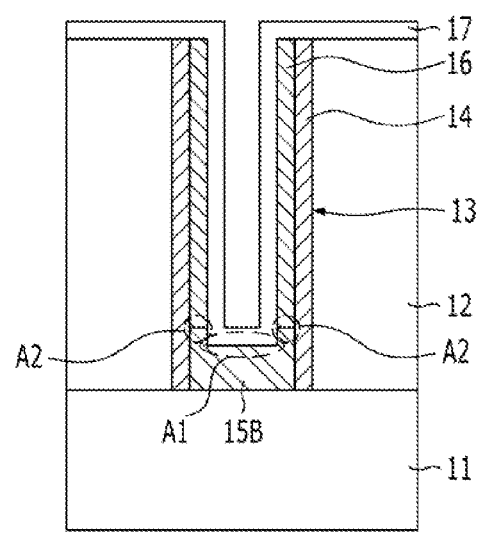

Referring to FIG. 2F, a silicidable layer 17 is formed. The silicidable layer 17 is conformally formed over the substrate structure including the sacrificial spacer 16 and the first conductive pattern 15б. The silicidable layer 17 includes a material that forms a metal silicide through a silicidation reaction with the first conductive pattern 15B. The silicidable layer 17 includes a silicidable metal layer. The silicidable metal layer may include a metal-containing layer that contains a metal atom such as cobalt. When the first conductive pattern 156 includes polysilicon, the silicidable layer 17 may include cobalt. The silicidable layer 17 may be deposited through a Physical Vapor Deposition (PVD) process.

When the silicidable layer 17 is formed as described above, the reaction area for forming a silicide is increased between the silicidable layer 17 and the first conductive pattern 156. For example, the increased reaction area includes a first reaction area A1 based on the recessed surface of the first conductive pattern 156 and a second reaction area A2 based on a protrusion of the first conductive pattern 156 The increase in the reaction area originates from the increase in the line width of the first conductive pattern 15B. This will be described by referring to the following Comparative Example.

Although not illustrated in the drawing, a protective layer may be formed over the silicidable layer 17. The protective layer may be conformally formed over the silicidable layer 17. The protective layer protects a silicide layer from being attacked in the subsequent siliciding process. The protective layer includes a metal nitride. The protective layer includes a titanium-containing layer. The protective layer may include a titanium nitride (TIN). The protective layer may be formed by stacking titanium and a titanium nitride (Ti/TiN).

Figure 2G:
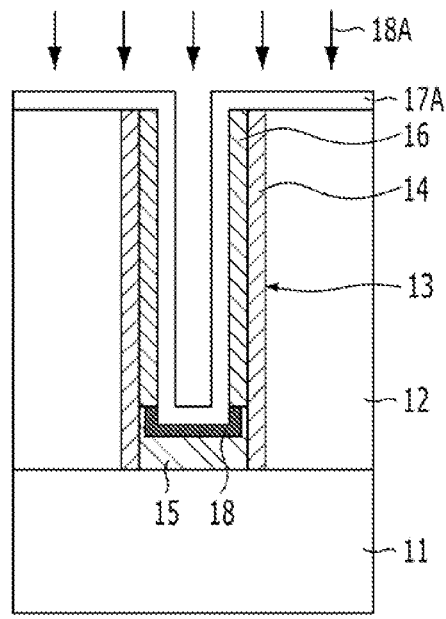

Referring to FIG. 2G, a second conductive pattern 18 is formed. The second conductive pattern 18 may be formed through an annealing process 18A. Through the annealing process 18A, the first conductive pattern 15B and the silicidable layer 17 react with each other to form the second conductive pattern 18. The annealing process 18A causes a silicidation reaction. Specifically, a silicidation reaction occurs on the interface between the first conductive pattern 156 and the silicidable layer 17 to form the second conductive pattern 18 including a metal silicide layer. The annealing process 18A may be performed at a temperature of approximately 200° C. or higher to cause the silicidation reaction between the first conductive pattern 156 and the silicidable layer 17. The annealing process 18A includes a Rapid Thermal Annealing (RTA) process. Through the annealing process 18A, a silicon atom of the first conductive pattern 156 and a metal atom of the silicidable layer 17 react with each other to form the second conductive pattern 18. The second conductive pattern 18 may include a cobalt silicide. In this embodiment of the present invention, the second conductive pattern 18 may include a cobalt silicide of "CoSi$_2$ phase". To this end, the annealing process 18A may be performed twice. For example, a primary annealing process may be performed at a temperature of approximately 400° C. to approximately 600° C. As a result of the primary annealing process, a cobalt silicide of "CoSi$_x$ phase" (x=0.1~1.5) is formed. Subsequently, a secondary annealing process is performed. The secondary annealing process includes the Rapid Thermal Annealing (RTA) process. The secondary annealing process may be performed at a higher temperature than that of the primary annealing process. The secondary annealing process may be performed at a temperature of approximately 600° C. to approximately 800° C. The secondary annealing process may be performed after a process of removing an unreacted silicidable layer 17A is performed. The secondary annealing process changes the phase of the second conductive pattern 18. For example, a cobalt silicide of "CoSi$_x$ phase" (x=0.1~1.5) is formed as a result of the primary annealing process, and the cobalt silicide of "CoSi$_x$ phase" (x=0.1~1.5) is phase-changed into a cobalt silicide of "CoSi$_2$ phase" through the secondary annealing process. Among cobalt silicides, the cobalt, silicide of "CoSi$_2$ phase" has the lowest resistivity.

After the second conductive pattern 18 is formed, there may be an unreacted silicidable layer 17A remaining. The volume of the first conductive pattern 15B may be reduced as represented by a reference numeral "15".

During the annealing process 18A, since the reaction area (see A1 and A2 of FIG. 2F) of silicon participating in the silicidation reaction is increased due to the recessed surface and protrusion of the first conductive pattern 15B, the cobalt silicide of "CoSi$_2$ phase" having a low resistivity may be formed. When the surface of the first conductive pattern 15B is not recessed, the reaction area of the silicon participating in the silicidation reaction is so insufficient that a cobalt silicide of "Co$_2$Si phase" having a high resistivity may be formed.

As described above, when the cobalt silicide of "CoSi$_2$ phase" is formed for the second conductive pattern 18, not only the contact resistance is decreased, but also a low-resistance cobalt silicide may be formed even in the small area of the opening 13 having a micro line width. The second conductive pattern 18 functions as an ohmic contact layer between the first conductive pattern 15 and a third conductive pattern.

Figure 2H:
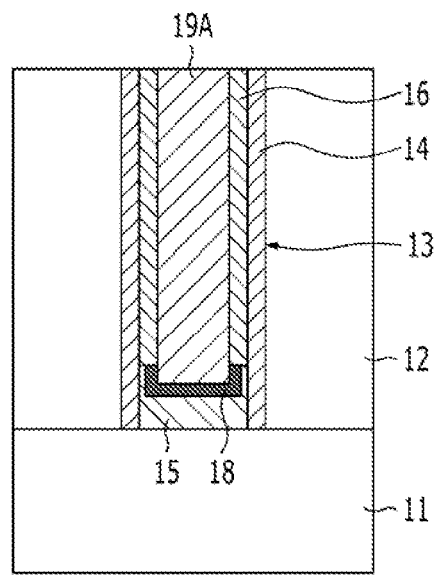

Referring to FIG. 2H, the unreacted silicidable layer 17A shown in FIG. 2G is removed.

Subsequently, a third conductive pattern 19A is formed over the second conductive pattern 18. The third conductive pattern 19A is formed over the second conductive pattern 18 to fill the opening 13. The third conductive pattern 19A may include a metal-containing layer. The third conductive pattern 19A may include a tungsten-containing material. The third conductive pattern 19A may include a tungsten layer or a tungsten compound layer. The third conductive pattern 19A may have the same height as that of the insulation layer 12. The line width of the third conductive pattern 19A is narrower than the first conductive pattern 15. The third conductive pattern 19A is higher than the first conductive pattern 15. Therefore, the volume of the third conductive pattern 19A is greater than that of the first conductive pattern 15 in the conductive structure formed in the opening 13.

As described above, a preliminary first conductive structure that includes the first conductive pattern 15, the second conductive pattern 18, the third conductive pattern 19A, and the sacrificial spacer 16 is formed within the opening 13. A spacer 14 is formed between the sidewalls of the preliminary first conductive structure and the opening 13. The sacrificial spacer 16 is formed to surround the sidewalls of the third conductive pattern 19A.

Figure 2I:
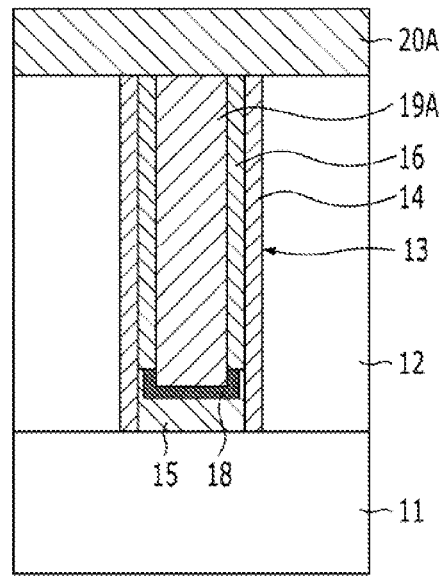

Referring to FIG. 2I, a fourth conductive layer 20A is formed over the third conductive pattern 19A. The fourth conductive layer 20A includes a metal-containing layer. The fourth conductive layer 20A may include a tungsten-containing material. The fourth conductive layer 20A may include a tungsten layer or a tungsten compound layer. The fourth conductive layer 20A may have a stacked structure including a metal-containing layer.

Figure 2J:
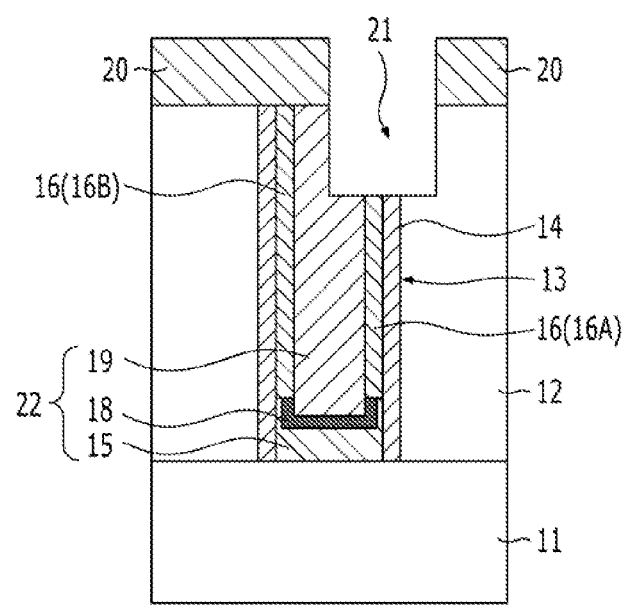
Figure 2K:
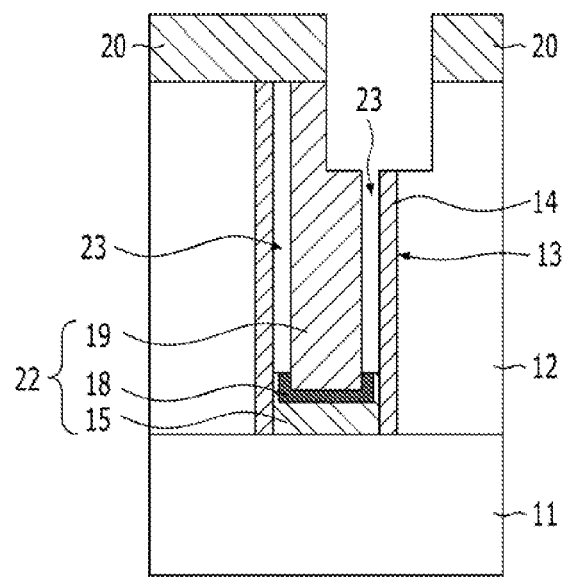

Referring to FIG. 2J, a fourth conductive pattern 20 is formed. The fourth conductive pattern 20 is formed by etching the fourth conductive layer 20A shown in FIG. 2I. A mask pattern (not shown) may be used to form the fourth conductive pattern 20. The fourth conductive pattern 20 is a pattern that covers a portion of the third conductive pattern 19A. Accordingly, through the fourth conductive pattern 20, a portion of the third conductive pattern 19A, a portion of the spacer 14, and a portion of the sacrificial spacer 16 are exposed.

Subsequently, the third conductive pattern 19A is self-aligned to the edge of the fourth conductive pattern 20 and etched to a predetermined depth. Being self-aligned to the edge of the fourth conductive pattern 20, the sacrificial spacer 16, the spacer 14 and the insulation layer 12 are partially etched to a predetermined depth. As a result, a recess 21 is formed. After the recess 21 is formed, the third conductive pattern remains as represented by reference numeral "19." When the recess 21 is formed, a mask pattern (not shown) may be used as an etch mask. When looked on a plan view, a portion of the remaining third conductive pattern 19 is covered with the fourth conductive pattern 20, and the recess 21 exposes another portion of the remaining third conductive pattern 19.

As described above, a first conductive structure 22 is formed within the opening 13 by forming the recess 21. The first conductive structure 22 includes the first conductive pattern 15, the second conductive pattern 18, and the remaining third conductive pattern 19. The fourth conductive pattern 20 becomes a second conductive structure. The sacrificial spacer 16 is partially etched while the recess 21 is formed. After the sacrificial spacer 16 is partially etched, the etched and exposed sacrificial spacer 16 remains as represented by a reference numeral "16A" and the sacrificial spacer 16 capped by the fourth conductive pattern 20 remains as represented by a reference numeral "16B", Referring to FIG. 2K, the sacrificial spacer 16 including the sacrificial spacer 16A and 16B is removed. A stripping process is performed to remove the sacrificial spacer 16. The stripping process includes a cleaning process. The cleaning process uses a wet chemical capable of removing the sacrificial spacer 16. The wet chemical removes the sacrificial spacer 16B under the fourth conductive pattern 20. The stripping process may include a cleaning process that is performed after the fourth conductive pattern 20 is etched, and in this case, the sacrificial spacer 16 is removed without an additional process.

The sacrificial spacer 16 is removed through the stripping process, and the space that has been occupied by the sacrificial spacer 16 becomes an air gap 23.

Referring to FIGS. 1C and 2J, the sacrificial spacer 16 including the sacrificial spacer 16A and 16B is formed to surround the third conductive pattern 19. The fourth conductive pattern 20 caps the sacrificial spacer 16B and does not cap the sacrificial spacer 16A. The wet chemical capable of removing the sacrificial spacer 16 gradually flows through the fourth conductive pattern 20 into the sacrificial spacer 16B, so that the sacrificial spacer 16 including the sacrificial spacer 16A and 16B that surrounds the sidewalls of the third conductive pattern 19, is removed.

The air gap 23 exists between the sidewalls of the remaining third conductive pattern 19 and the sidewalls of opening 13. An insulation structure of the air gap 23—spacer 14 is formed between the side ails of the remaining third conductive pattern 19 and the sidewalls of opening 13. The second conductive pattern 18 is exposed under the air gap 23 but the first conductive pattern 15 is not exposed. As described above, the air gap 23 is formed between the sidewalls of the remaining third conductive pattern 19 and the opening 13, through the stripping process. The air gap 23 is a surrounding-type gap that encloses the sidewall of the remaining third conductive pattern 19.

Figure 2L:
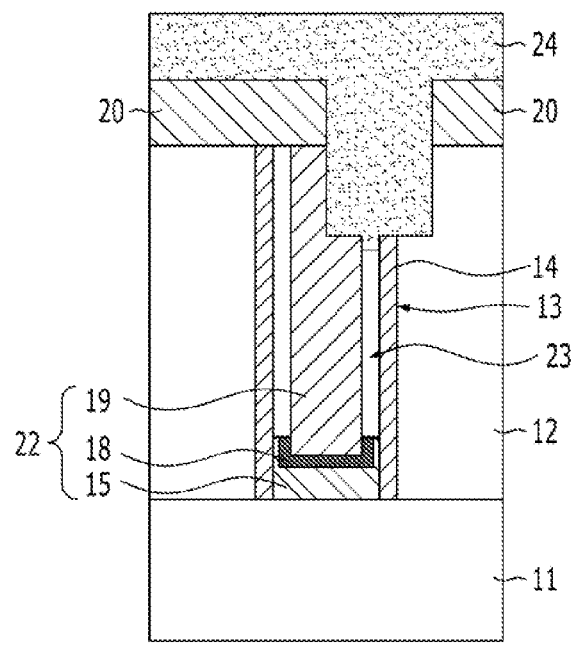

Referring to FIG. 2L, a capping structure 24 is formed. The capping structure 24 includes a dielectric material. The capping structure 24 may include a dielectric material having a low step coverage. For example, the capping structure 24 may be formed through a Plasma Enhanced Chemical Vapor Deposition (PECVD) process, therefore, the capping structure 24 may clog the entrance of the air gap 23. The capping structure 24 includes a silicon oxide layer or a silicon nitride layer. The capping structure 24 may be a silicon nitride layer formed through the PECVD process. The capping structure 24 gap-fills the recess 21 and caps the air gap 23. Also, the capping structure 24 covers the upper portion of the fourth conductive pattern 20. The capping structure 24 may be formed by conformally lining a first capping layer(not shown) and then gap-filling a second capping layer(not shown)

As described above, a portion of the air gap 23 is capped with the fourth conductive pattern 20, and the other portion of the al gap 23 is capped with the capping structure 24.

The first conductive structure 22 formed with the opening 13 includes the first conductive pattern 15, the second conductive pattern 18, and the remaining third conductive pattern 19. A second conductive structure including the fourth conductive pattern 20 is electrically connected to the upper portion of the first conductive structure 22.

In accordance with the first embodiment of the present invention and its modified example, the electrical insulation characteristics of the first conductive structure 22 are improved by forming the air gap 23. For example, when there is another conductive pattern adjacent to the first conductive structure 22, parasitic capacitance between the two conductive patterns is decreased.

Also, since the air gap 23 is formed after the second conductive pattern 18 is formed, the second conductive pattern 18 may be formed in a wide area. Accordingly, interfacial resistance may be decreased.

Figure 3A:
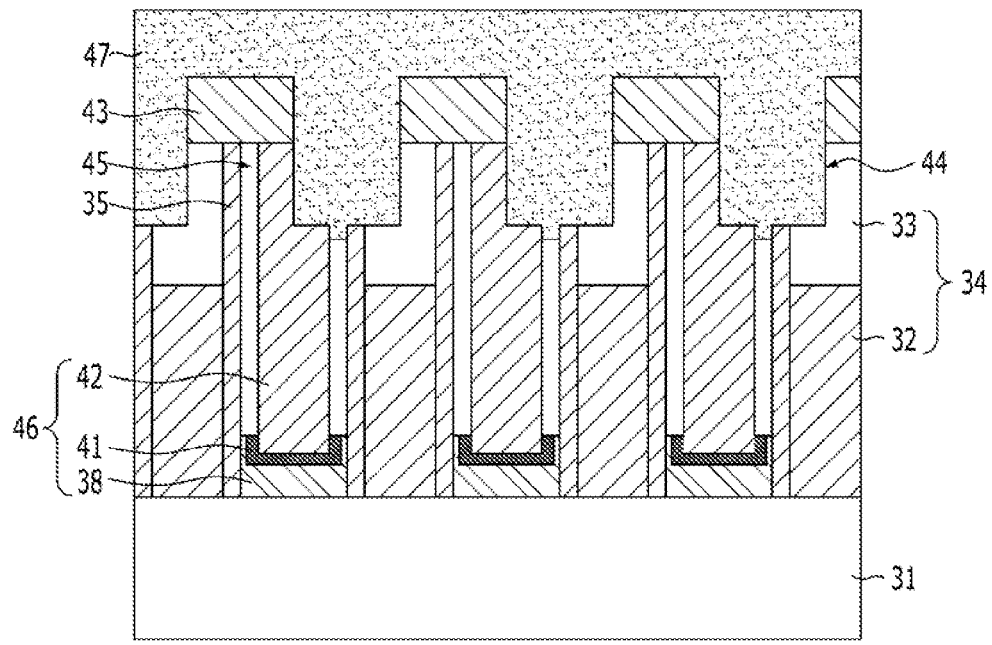
FIG. 3A is a cross-sectional view illustrating a semiconductor device in accordance with a second embodiment of the present invention.
Figure 3B:
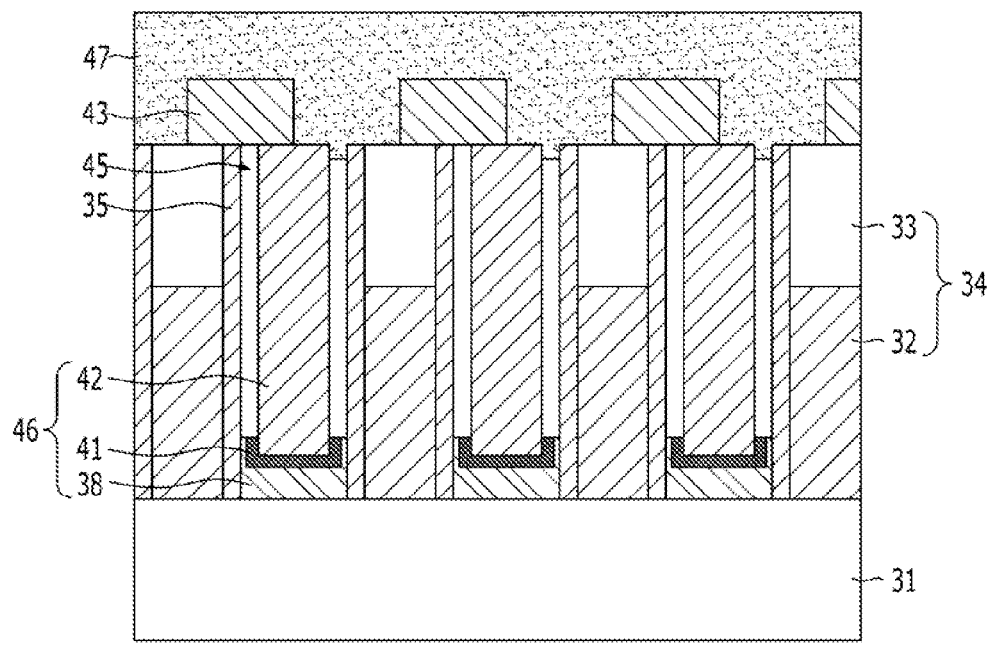
FIG. 3B is a cross-sectional view illustrating a semiconductor device in accordance with a modified example of the second embodiment of the present invention.
Figure 3C:
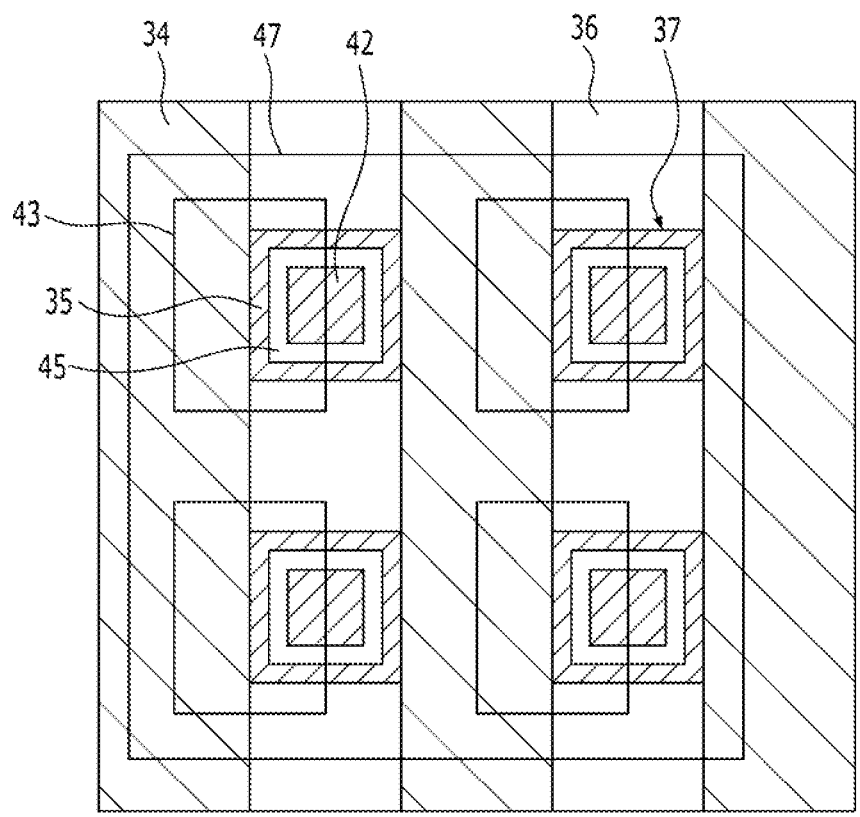
FIG. 3C is a plan view illustrating the semiconductor device in accordance with the second embodiment of the present invention and the modified example thereof.

Furthermore, since the remaining third conductive pattern 19 including a metal-containing material has a greater volume than the first conductive pattern 15 including a silicon-containing material, the contact resistance of the first conductive structure 22 may be decreased, FIG. 3A is a cross-sectional view illustrating a semiconductor device in accordance with a second embodiment of the present invention. FIG. 3B is a cross-sectional view illustrating a semiconductor device in accordance with a modified example of the second embodiment of the present invention. FIG. 3C is a plan view illustrating the semiconductor device in accordance with the second embodiment of the present invention and the modified example thereof.

Referring to FIG. 3A, a plurality of conductive structures are formed over a substrate 31. Each conductive structure includes a first conductive structure 34 and a second conductive structure 46. An insulation structure having an air gap 45 is formed between the sidewalls of the first conductive structure 34 and the sidewalls of the second conductive structure 46. A spacer 35 is formed on the side all of the first conductive structure 34. The air gap 45 is formed between the spacer 35 and the sidewalls of the second conductive structure 46. The first conductive structure 34 includes a first conductive pattern 32 and an insulation pattern 33. The second conductive structure 46 includes a second conductive pattern 38, a third conductive pattern 41, and a fourth conductive pattern 42. A portion of the air gap 45 is capped with a third conductive structure 43. The other portion of the air gap 45 is capped with a capping structure 47.

The substrate includes a semiconductor substrate. The substrate 31 includes a silicon substrate, a silicon germanium substrate, or a Silicon On Insulator (SOI) substrate.

The first conductive structure 34 includes the first conductive pattern 32. The first conductive structure 34 may have a stacked structure where the first conductive pattern 32 and the insulation pattern 33 are stacked. The first conductive pattern 32 may include a silicon-containing layer or a metal-containing layer. The first conductive pattern 32 may include a silicon-containing layer and a metal-containing layer stacked therein. The first conductive pattern 32 may include polysilicon, a metal, a metal nitride, and/or a metal silicide. The first conductive pattern 32 may include a polysilicon layer and a metal layer stacked therein. The metal layer may include tungsten.

The insulation pattern 33 includes a dielectric material. The insulation pattern 33 may include an oxide or a nitride. A hard mask pattern may be the insulation pattern 33. The first conductive structure 34 and the second conductive structure 46 may have a line shape or a pillar shape. Also, one between the first conductive structure 34 and the second conductive structure 46 may have a shape of a line stretched in one direction. The other one may have a pillar shape. For example, the first conductive structure 34 may be a line-shaped structure, while the second conductive structure 46 may be a pillar-shaped structure. The first conductive structures 34 are regularly disposed over the substrate 31 with a predetermined gap between them. One between the first conductive structure 34 and the second conductive structure 46 may be a gate structure or a bit line structure, and the other may be a contact plug. A contact plug may include a storage node contact plug, a landing plug, and a metal contact plug. For example, the second conductive structure 46 may be a contact plug, and the contact plug may have a stacked structure of a silicon plug, an ohmic contact layer, and a metal plug.

The second conductive structure 46 includes the second conductive pattern 38 that is formed by being recessed between the neighboring first conductive structures 34. The second conductive structure 46 may have a stacked structure including the second conductive pattern 38, the third conductive pattern 41, and the fourth conductive pattern 42. The second conductive pattern 38 may include a silicon-containing layer. The second conductive pattern 38 may include a polysilicon layer. The fourth conductive pattern 42 may include a metal-containing layer. The third conductive pattern 41 is formed between the second conductive pattern 38 and the fourth conductive pattern 42. The third conductive pattern 41 is an ohmic contact layer between the second conductive pattern 38 and the fourth conductive pattern 42. The third conductive pattern 41 includes a metal silicide. The metal silicide includes a cobalt silicide. The cobalt silicide includes a cobalt silicide of "$CoSi_2$ phase."

The surface of the second conductive pattern 38 has a height recessed lower than the surface of the first conductive pattern 32. The line width of the fourth conductive pattern 42 is narrower than that of the second conductive pattern 38, and the height of the fourth conductive pattern 42 is higher than that of the second conductive pattern 38. Accordingly, the volume of the fourth conductive pattern 42 is greater than that of the second conductive pattern 38. An insulation structure (refer to reference numeral '36' of FIG. 3C) having an opening (refer to reference numeral '37' of FIG. 3C) is formed between the neighboring first conductive structures 34, and the second conductive structure 46 may be formed within the opening 37. The opening 37 may expose the sidewalls of the neighboring first conductive structures 34.

A spacer 35 is formed on the sidewalls of the first conductive structure 34. The spacer 35 includes a low-k dielectric material. The low-k dielectric material includes an oxide or a nitride. The spacer 35 may include a silicon oxide, a silicon nitride, or a metal oxide.

The air gap 45 may be formed by removing a sacrificial material formed between the fourth conductive pattern 42 and the spacer 35.

The third conductive structure 43 overlaps with a portion of the second conductive structure 46 while capping a portion of the air gap 45. The third conductive structure 43 may be extended to the upper surface of the first conductive structure 34. The third conductive structure 43 includes a metal-containing layer. The third conductive structure 43 may include a tungsten layer.

The capping structure 47 covers the upper portion of the third conductive structure 43 while capping the other portion of the air gap 45. The capping structure 47 includes a dielectric material. The capping structure 47 includes a silicon nitride or a silicon oxide. The capping structure 47 may include a silicon nitride deposited through a Plasma Enhanced Chemical Vapor Deposition (PECVD) process.

A recess 44 is formed by being self-aligned to the edge of the third conductive structure 43 and recessing a portion of the second conductive structure 46 and a portion of the air gap 45. The recess 44 may also be formed by recessing a portion of the first conductive structure 34. The capping structure 47 is formed in the recess 44.

Referring to FIG. 3B, the air gap 45 is capped with the capping structure 47 and the third conductive structure 43 without the recess 4.

Referring to FIG. 3C, the air gap 45 is capped with the third conductive structure 43 and the capping structure 47. A portion of the air gap 45 is capped with the third conductive structure 43, and the other portion of the air gap 45 is capped with the capping structure 47. The air gap 45 is formed between the first conductive structure 34 and the fourth conductive pattern 42. An insulation structure 36 is formed between the neighboring first conductive structures 34. The opening 37 is formed in the insulation structure 36. The second conductive structure 46 is formed within the opening 37. The spacer 35 is formed on the sidewalls of the opening 37.

In accordance with the second embodiment of the present invention and its modified example, the air gap 45 is stably capped with the third conductive structure 43 and the capping structure 47. With the air gap 45, the parasitic capacitance between the first conductive structure 34 and the second conductive structure 46 is decreased.

The air gap 45 may be formed after the third conductive pattern 41 and the fourth conductive pattern 42 are formed over the second conductive pattern 38. As a result, the area where the third conductive pattern 41 is to be formed may be secured to be wide. The resistance of the second conductive structure 46 may be reduced by minimizing the volume of the second conductive pattern 38, which is a silicon-containing layer, and maximizing the volume of the fourth conductive pattern 42, which is a metal-containing layer. Moreover, with the third conductive pattern 41, which is an ohmic contact layer, the resistance is decreased even more, and since the third conductive pattern 41 is formed in a wide area, interface resistance is decreased.

The second conductive structure 46 in accordance with the second embodiment of the present invention and its modified example may be a plug. The third conductive structure 43 may be a plug or a line layer. The second conductive structure 46 and the third conductive structure 43 may be a multi-layer plug. For example, the second conductive structure 46 may be a first plug structure, and the third conductive structure 43 may be a second plug structure. The second conductive structure 46 has a structure where a silicon plug, an ohmic contact layer, and a metal plug are stacked, and the air gap 45 may be formed on the sidewalls of the metal plug. The second conductive structure 46 and the third conductive structure 43 may be a plug for coupling a transistor with a memory element.

The second conductive structure 46 and the third conductive structure 43 may be a plug for coupling a transistor with a metal line. Additionally, the second conductive structure 46 may be a line layer, and the third conductive structure 43 may be a plug. Herein, the line layer includes bit lines, metal lines, gate electrodes, word lines, or through silicon vias. Although not illustrated in the drawing, a fourth conductive structure may be further formed over the third conductive structure 43. The fourth conductive structure may be a portion of a memory element that is electrically connected to the third conductive structure 43. The memory element may include a capacitor formed of a storage node, a dielectric layer, and a plate node, and the fourth conductive structure may include a storage node. The memory element may be realized in diverse forms. For example, the memory element may include a variable resistive material. The memory element may be formed by sequentially stacking a first electrode, a variable resistive material, and a second electrode, and the fourth conductive structure may include the first electrode electrically connected to the third conductive structure 43. A data may be stored and identified depending on the resistance of the variable resistive material which is changed according to the voltage applied to the first electrode and the second electrode. The variable resistive material may include a phase-change material or a magnetic tunneling junction.

FIGS. 4A to 4K are cross-sectional views describing a method for fabricating the semiconductor device in accordance with the second embodiment of the present invention.

Figure 4A:
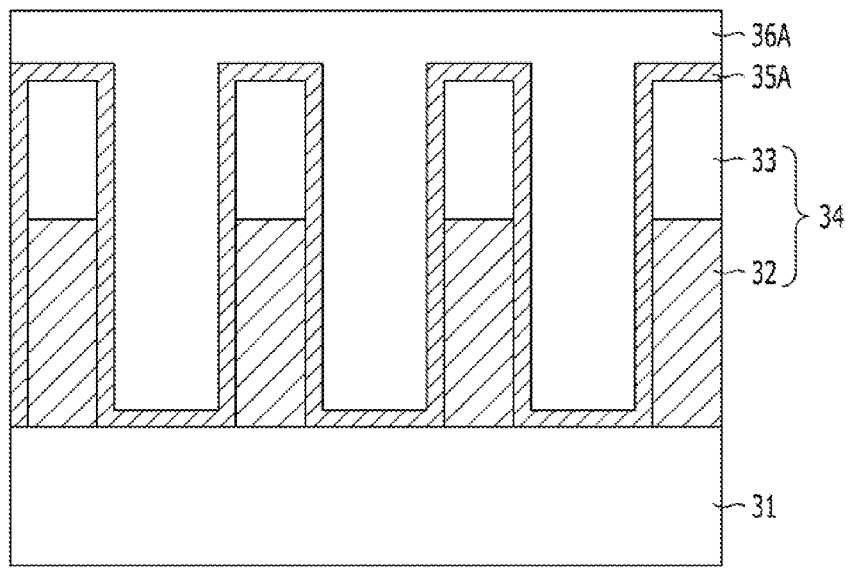
FIGS. 4A to 4K are cross-sectional views describing a method for fabricating the semiconductor device in accordance with the second embodiment of the present invention.

Referring to FIG. 4A, a plurality of first conductive structures 34 are formed over a substrate 31. The substrate 31 includes a semiconductor substrate. The substrate 31 contains silicon. The substrate 31 may include a silicon substrate or a silicon germanium substrate. Also, the substrate 31 may include a Silicon On Insulator (SOI) substrate.

The first conductive structures 34 formed over the substrate 31 are regularly disposed with a predetermined gap between them. A hard mask pattern 33 is formed over a first conductive layer (not shown) to form the first conductive structures 34. A first conductive pattern 32 is formed by using the hard mask pattern 33 as an etch mask and etching the first conductive layer (not shown). A first conductive structure 34 where the first conductive pattern 32 and the hard mask pattern 33 are stacked is formed. The first conductive pattern 32 includes a silicon-containing layer or a metal--containing layer. For example, the first conductive pattern 32 may include polysilicon or tungsten. Also, the first conductive pattern 32 is formed by stacking a silicon-containing layer and a metal-containing layer. For example, the first conductive pattern 32 may be formed by stacking a polysilicon layer and a tungsten layer. A barrier layer may be further formed between the polysilicon layer and the tungsten layer. The first conductive pattern 32 may be a stacked structure including a polysilicon layer, a titanium-containing layer, and a tungsten layer. The titanium-containing layer is a barrier layer, and titanium (Ti) and a titanium nitride (TIN) may be stacked. The hard mask pattern 33 is formed of a dielectric material.

A first insulation layer 35A is formed over the multiple first conductive structures 34. The first insulation layer 35A includes a low-k dielectric material. The first insulation layer 35A includes a nitride or an oxide. For example, the first insulation layer 35A may include a silicon nitride or a silicon oxide. The first insulation layer 35A is conformally formed over the substrate structure including the first conductive structures 34. The first insulation layer 35A is a material that later becomes a spacer.

A second insulation layer 36A is formed over the first insulation layer 35A. The second insulation layer 36A may include a silicon oxide. The second insulation layer 36A may be formed over the first insulation layer 35A to fill the space between the first conductive structures 34. The second insulation layer 36A becomes an insulation layer 36

Figure 4B:
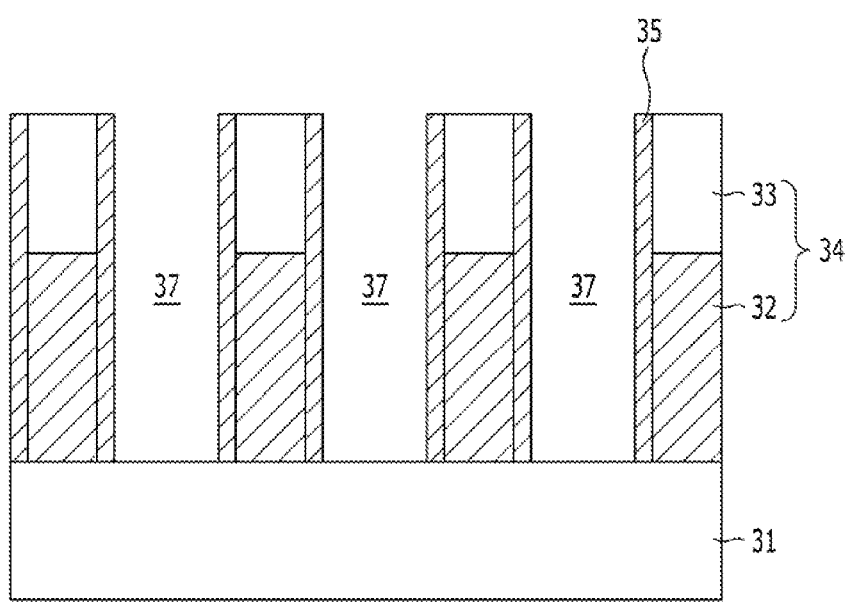

Referring to FIG. 4B, the second insulation layer 36A is planarized. The second insulation layer 36A may be planarized to expose the surface of the first insulation layer 35A over the first conductive structures 34.

Openings 37 are formed by etching the second insulation layer 36A. The insulation layer 36 obtained after the openings 37 are formed is not shown in the cross-sectional view. A mask pattern (not shown) may be used to form the openings 37. The openings 37 may have a hole shape or a line shape. The openings 37 may be formed between the first conductive structures 34. The first insulation layer 35A may be exposed on the sidewalls of each opening 37. To form the openings 37, the second insulation layer 36A may be etched to be aligned to the first conductive structures 34 and the first insulation layer 35A.

The first insulation layer 35A may remain over the substrate 31 under the openings 37.

Subsequently, the surface of the substrate 31 is exposed by etching the first insulation layer 35A. Since the first insulation layer 35A is etched, a spacer 35 is formed on the sidewalls of each first conductive structure 34.

According to another embodiment of the present invention, the spacers 35 are formed after the openings 37 are formed. That is, after the openings 37 are formed, the first insulation layer 35A is formed over the first conductive structures 34 and the insulation layer 36. The spacers 35 are formed by etching the first insulation layer 35A. According to yet another embodiment of the present invention, the spacers 35 may be omitted.

Figure 4C:
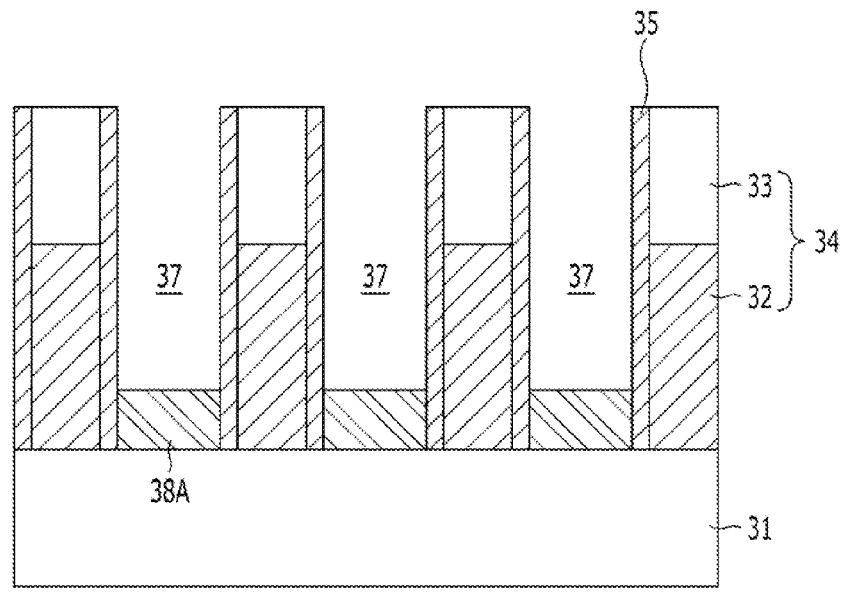

Referring to FIG. 4C, a second conductive pattern 38A is formed. A second conductive layer (not shown) filling the openings 37 is formed over the substrate structure including the spacers 35. The second conductive layer (not shown) is etched through an etch-back process. As a result, the second conductive pattern 38A recessed in the openings 37 is formed. The second conductive pattern 38A has its recessed surface lower than the upper surface of the first conductive structures 34. The second conductive pattern 38A includes a silicidable material. The second conductive pattern 38A may include a silicon-containing layer. The second conductive pattern 38A may include polysilicon. The polysilicon may be doped with an impurity. The second conductive pattern 38A is in contact with the surface of the substrate 31. The height of the second conductive pattern 38A may be controlled to be as low as possible. This is to minimize the share of the second conductive pattern 38A in the total volume of a second conductive structure.

Figure 4D:
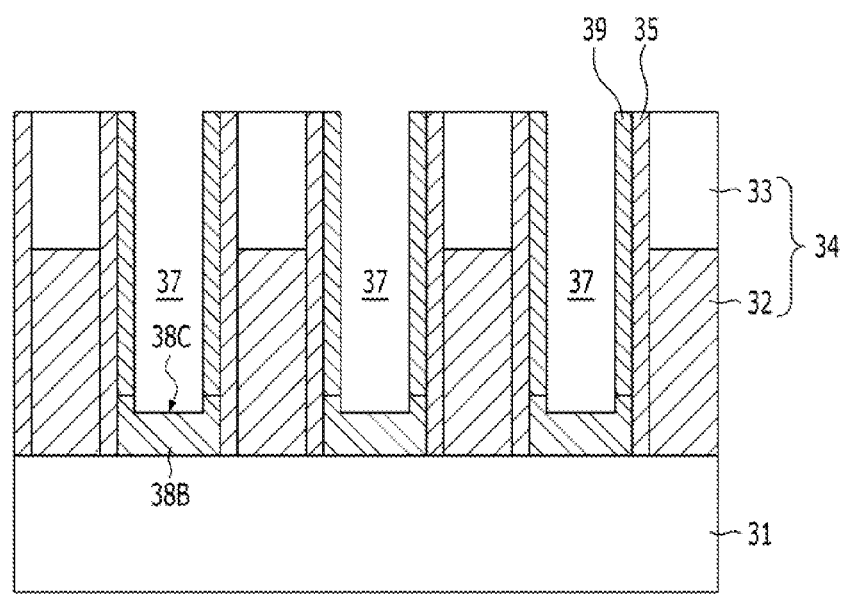
Figure 4E:
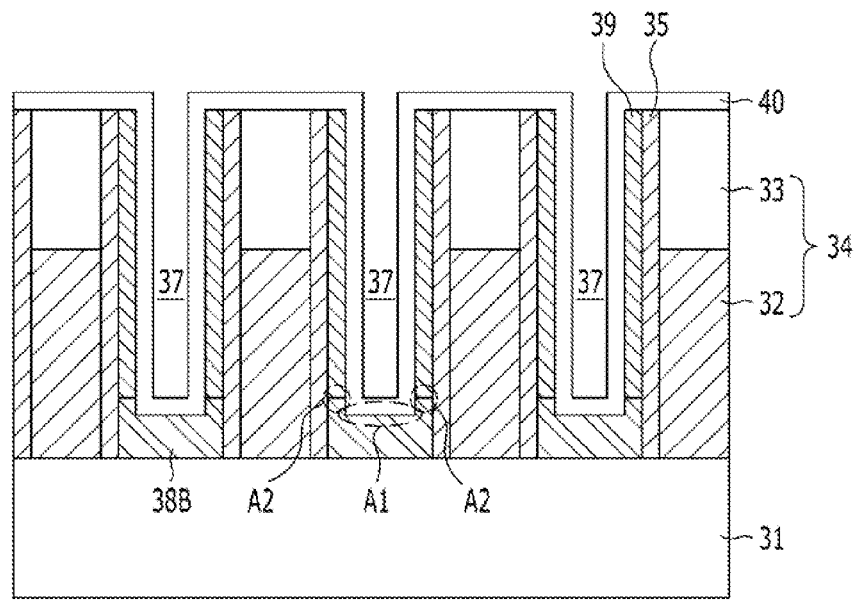

Referring to FIG. 4D, sacrificial spacers 39 are formed. Each sacrificial spacer 39 is formed on the sidewall of each opening 37 over the second conductive pattern 38A. The sacrificial spacers 39 may be formed by selectively etching a sacrificial layer (not shown). A dry etch process may be performed to form the sacrificial spacers 39. For example, the dry etch process may include an etch-back process. Through the etch process of forming the sacrificial spacers 39, the upper surface of the second conductive pattern 38A is exposed. The sacrificial spacers 39 are removed in the subsequent process to form air gaps. The sacrificial spacers 39 may include a dielectric material, and the sacrificial spacers 39 may include a silicon oxide or a silicon nitride. The sacrificial spacers 39 may be formed by stacking a silicon oxide and a silicon nitride.

When the sacrificial spacers 39 are formed or after the sacrificial spacers 39 are formed, the surface of the second conductive pattern 38A may be recessed to a predetermined depth (refer to reference numeral '38C'). The recessed second conductive pattern is denoted as a reference numeral '38B'. The second conductive pattern 38A is recessed to widen the reaction area for forming a silicide layer later, Referring to FIG. 4E, a silicidable layer 40 is formed. The silicidable layer 40 is conformally formed over the substrate structure including the sacrificial spacers 39 and the recessed second conductive pattern 38B. The silicidable layer 40 includes a material that forms a metal silicide through a silicidation reaction with the recessed second conductive pattern 38B. The silicidable layer 40 includes a silicidable metal layer. The silicidable metal layer may include a metal-containing layer that contains a metal atom such as cobalt. When the recessed second conductive pattern 38B includes polysilicon, the silicidable layer 40 may include cobalt. The silicidable layer 40 may be deposited through a Physical Vapor Deposition (PVD) process.

When the silicidable layer 40 is formed as described above, the reaction area for forming a silicide is increased between the silicidable layer 40 and the recessed second conductive pattern 38B. For example, the increased reaction area includes a first reaction area A1 based on the recessed surface of the recessed second conductive pattern 38B and a second reaction area A2 based on a protrusion of the recessed second conductive pattern 38B. The increase in the reaction area originates from the increase in the line width of the recessed second conductive pattern 38B. This will be described by referring to the following comparative example.

Although not illustrated in the drawing, a protective layer may be formed over the silicidable layer 40. The protective layer may be conformally formed over the silicidable layer 40. The protective layer protects a silicide layer from being attacked in the subsequent siliciding process. The protective layer includes a metal nitride. The protective layer includes a titanium-containing layer. The protective layer may include a titanium nitride (TiN). The protective layer may be formed by stacking titanium and a titanium nitride (Ti/TiN).

Figure 4F:
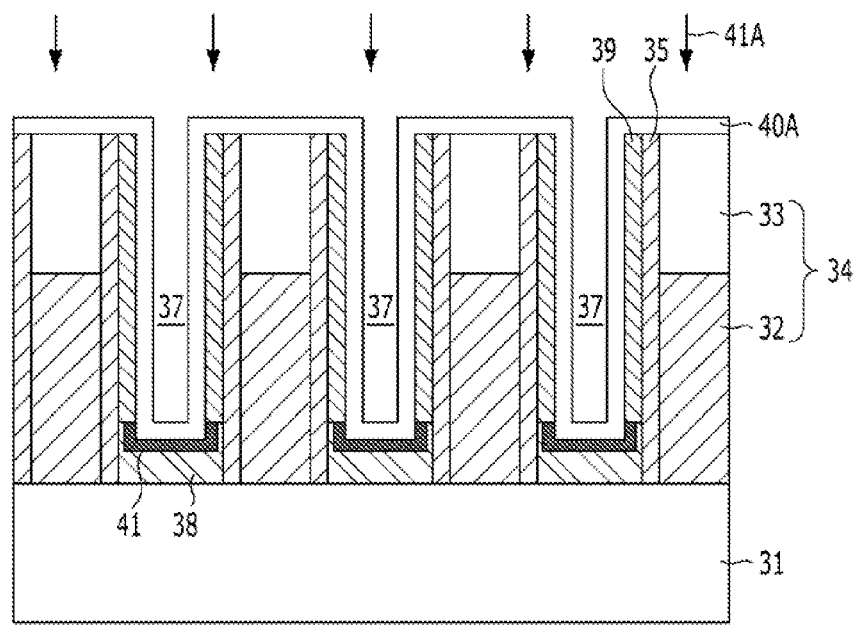

Referring to FIG. 4F, a third conductive pattern 41 is formed. The third conductive pattern 41 may be formed through an annealing process 41A. Through the annealing process 41A, the recessed second conductive pattern 38B and the silicidable layer 40 react with each other to form the third conductive pattern 41. The annealing process 41A causes a silicidation reaction. Specifically, a silicidation reaction occurs on the interface between the recessed second conductive pattern 38B and the silicidable layer 40 to form the third conductive pattern 41 including a metal silicide layer. The annealing process 41A may be performed at a temperature of approximately 200° C. or higher to cause the silicidation reaction between the silicidable layer 40 and the recessed second conductive pattern 38B. The annealing process 41A includes a Rapid Thermal Annealing (RTA) process. Through the annealing process 41A, a silicon atom of the recessed second conductive pattern 38B and a metal atom of the silicidable layer 40 react with each other to form the third conductive pattern 41. The third conductive pattern 41 may include a cobalt silicide. In this embodiment of the present invention, the third conductive pattern 41 may include a cobalt silicide of "$CoSi_2$ phase." To this end, the annealing process 41A may be performed twice. For example, a primary annealing process may be performed at a temperature of approximately 400° C. to approximately 600° C. As a result of the primary annealing process, a cobalt silicide of "$CoSi_x$ phase" (x=0.1~1.5) is formed. Subsequently, a secondary annealing process is performed. The secondary annealing process includes the Rapid Thermal Annealing (RTA) process. The secondary annealing process may be performed at a higher temperature than that of the primary annealing process. The secondary annealing process may be performed at a temperature of approximately 600° C. to approximately 800° C. The secondary annealing process changes the phase of the third conductive pattern 41. For example, a cobalt silicide of "$CoSi_x$ phase" (x=0.1~1.5) is formed as a result of the primary annealing process, and the cobalt silicide of "$CoSi_x$ phase" (x=0.1~1.5) is phase-changed into a cobalt silicide of "$CoSi_2$ phase" through the secondary annealing process. Among cobalt silicides, the cobalt silicide of "$CoSi_2$ phase" has the lowest resistivity.

After the third conductive pattern 41 is formed, there may be an unreacted silicidable layer 40A remaining. The volume of the recessed second conductive pattern 38B may be reduced as represented by a reference numeral "38."

During the annealing process 41A, since the reaction area (see A1 and A2 of FIG. 4E) of silicon participating in the silicidation reaction is increased due to the recessed surface and protrusion of the recessed second conductive pattern 38B, the cobalt silicide of "$CoSi_2$ phase" having a low resistivity may be formed. When the surface of the recessed second conductive pattern 38B is not recessed, the reaction area of the silicon participating in the silicidation reaction is so insufficient that a cobalt silicide of "$Co_2Si$ phase" having a high resistivity may be formed.

As described above, when the cobalt silicide of "$CoSi_2$ phase" is formed for the third conductive pattern 41, not only the contact resistance is decreased, but also a low-resistance cobalt silicide may be formed even in the small area of the openings 37 having a micro line width. The third conductive pattern 41 functions as an ohmic contact layer.

Figure 4G:
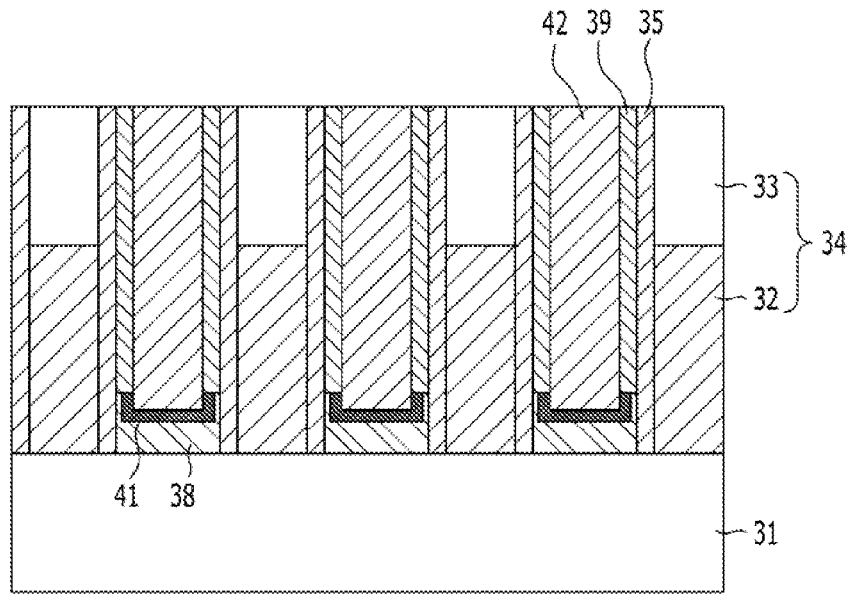

Referring to FIG. 4G, the unreacted silicidable layer 40A shown in FIG. 4F is removed.

Subsequently, a fourth conductive pattern 42 is formed over the third conductive pattern 41 to fill the openings 37. The fourth conductive pattern 42 may include a metal-containing layer. The fourth conductive pattern 42 may include a tungsten-containing material. The fourth conductive pattern 42 may include a tungsten layer or a tungsten compound layer.

The height of the fourth conductive pattern 42 may be higher than that of the second conductive pattern 38. The line width of the fourth conductive pattern 42 is narrower than the second conductive pattern 38. Therefore, the volume of the fourth conductive pattern 42 is greater than that of the second conductive pattern 38.

As described above, when the fourth conductive pattern 42 is formed, a preliminary second conductive structure is formed within the openings 37. The preliminary second conductive structure includes the second conductive pattern 38, the third conductive pattern 41, the fourth conductive pattern 42, and the sacrificial spacers 39. The sacrificial spacers 39 may have a surrounding form that encloses the sidewalls of the fourth conductive pattern 42.

Figure 4H:
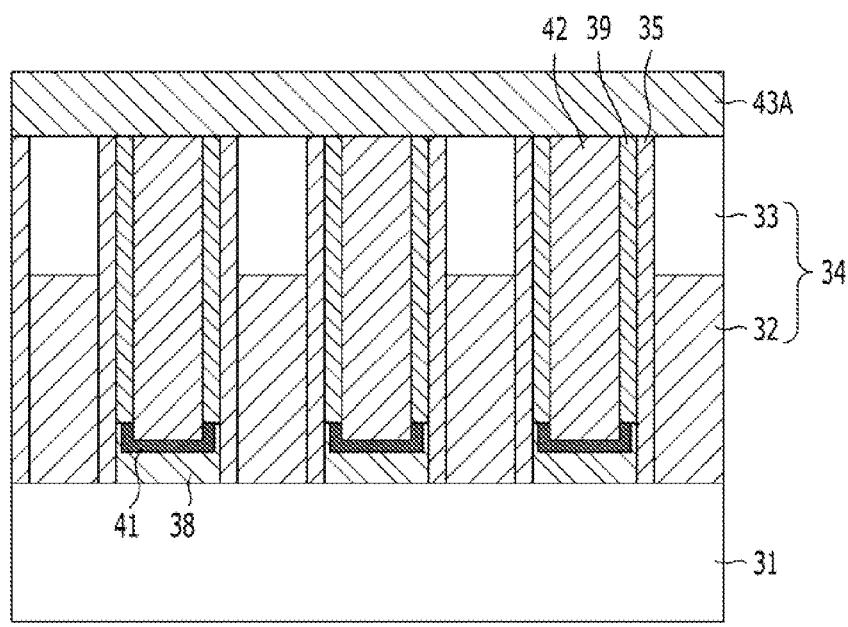

Referring to FIG. 4H, a fifth conductive layer 43A is formed over the fourth conductive pattern 42. The fifth conductive layer 43A includes a metal-containing layer. The fifth conductive layer 43A may include a tungsten-containing material. The fifth conductive layer 43A may include a tungsten layer or a tungsten compound layer.

Figure 4I:
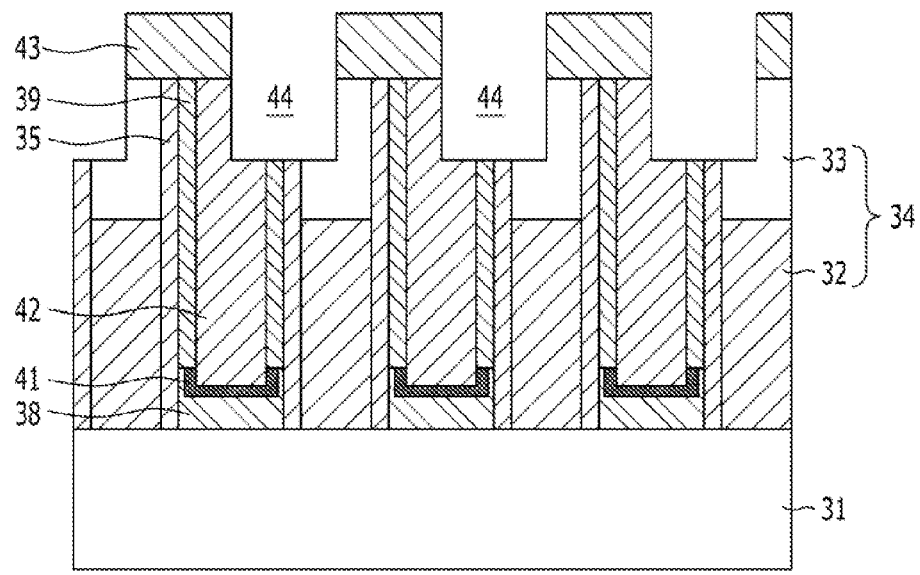
Figure 4J:
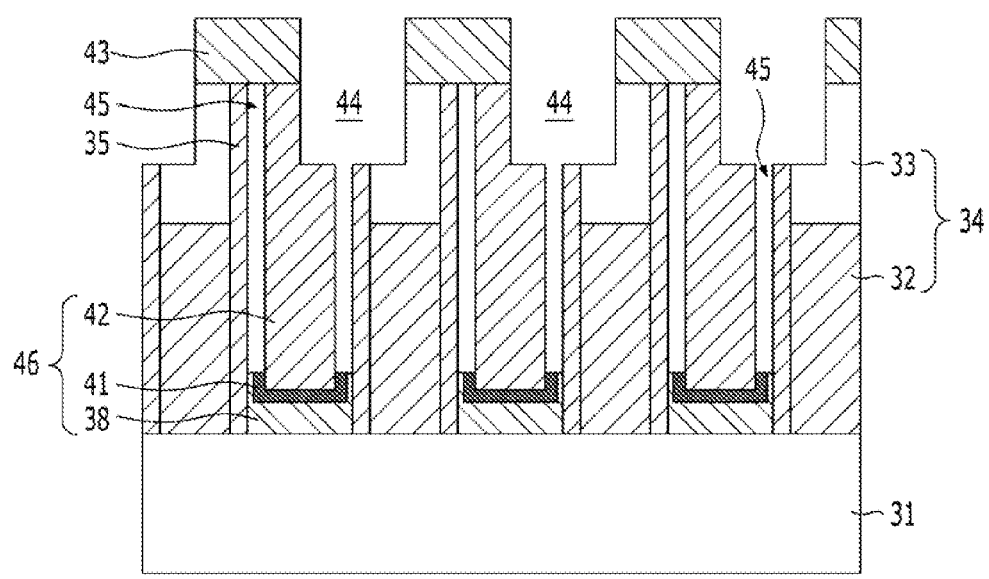

Referring to FIG. 4I, third conductive structures 43 are formed. The third conductive structures 43 are formed by etching the fifth conductive layer 43A shown in FIG. 4H. A mask pattern (not shown) may be used to form the third conductive structures 43. The third conductive structures 43 are a pattern that covers a portion of the fourth conductive pattern 42. Accordingly, through each third conductive structure 43, a portion of the fourth conductive pattern 42, a portion of each spacer 35, and a portion of each sacrificial spacer 39 are exposed.

Subsequently, recesses 44 are formed. The fourth conductive pattern 42 exposed through the third conductive structures 43 is etched to a predetermined depth and a portion of the sacrificial spacer 39, a portion of the spacer 35, and a portion of the hard mask pattern 33 are etched to a predetermined depth, Referring to FIG. 4J, air gaps 45 are formed by removing the sacrificial spacers 39. Each air gap 45 is formed between the sidewall of the fourth conductive pattern 42 and the sidewall of each first conductive structure 34. The sacrificial spacers 39 may be removed through a wet etch process. A cleaning process using a wet chemical may be performed to remove the sacrificial spacers 39. The cleaning process may include a cleaning process that is performed after the third conductive structures 43 are etched. In this manner, the sacrificial spacers 39 may be removed without an additional process.

The sacrificial spacers 39 are removed through the above-described process, and the space occupied by the sacrificial spacers 39 remains as the air gaps 45.

The air gaps 45 are formed between the sidewalls of the fourth conductive pattern 42 and the sidewalls of each first conductive structure 34. An insulation structure of "air gap 45-spacer 35" is formed between the sidewalls of the fourth conductive pattern 42 and the sidewalls of each first conductive structure 34. The third conductive pattern 41 is exposed under the air gaps 45, but the second conductive pattern 38 is not exposed.

The air gaps 45 may be surrounding-type gaps each of which encloses the sidewalls of the fourth conductive pattern 42. Second conductive structures 46 are formed within the openings by the recesses 44. Each second conductive structure 46 includes the second conductive pattern 3, third conductive pattern 41, and the fourth conductive pattern 42.

Figure 4K:
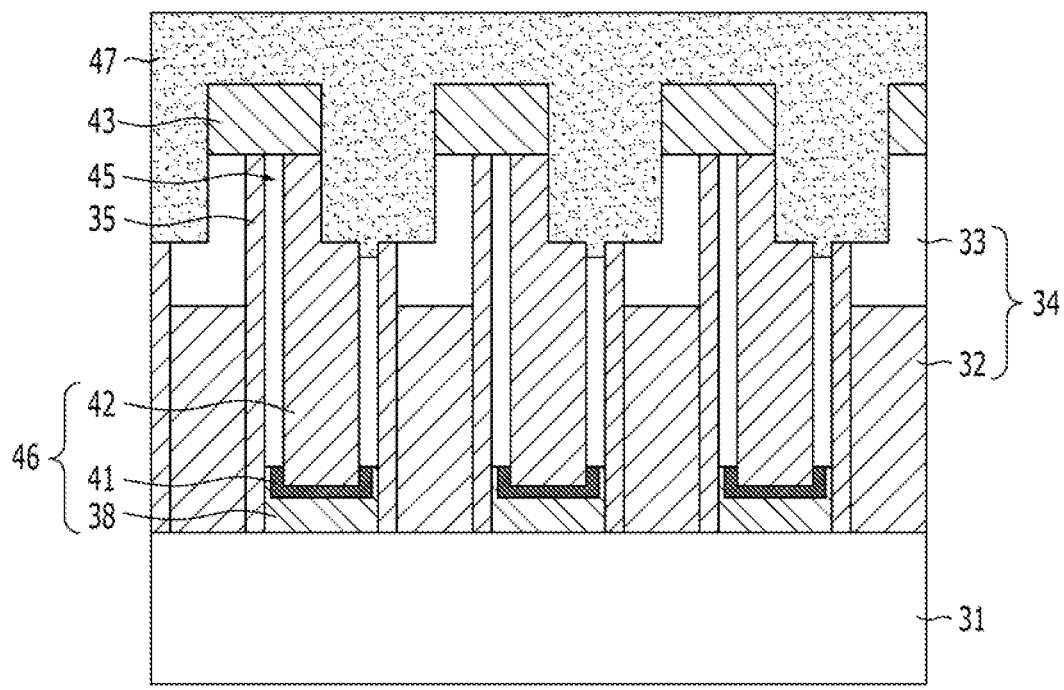

Referring to FIG. 4K, capping structures 47 are formed. The capping structures 47 include a dielectric material. The capping structures 47 may include a dielectric material having a low step coverage. For example, the capping structures 47 may be formed through a Plasma Enhanced Chemical Vapor Deposition (PECVD) process, therefore, the capping structures 47 may dog the entrances of the air gaps 45. The capping structures 47 include a silicon oxide layer or a silicon nitride layer. The capping structures 47 may be a silicon nitride layer formed through the PECVD process.

The capping structures 47 gap-fill the recesses 44 while capping the air gaps 45. Additionally, the capping structures 47 cover the upper portions of the third conductive structures 43. The capping structures 47 may be formed by conformally lining a first capping layer then gap-filling a second capping layer.

As described above, a portion of each air gap 45 is capped with a third conductive structure 43, and the other portion of the air gap 45 is capped with the capping structure 47.

The second conductive structures 46 formed within the openings 37 include the second conductive pattern 38, the third conductive pattern 41 and the fourth conductive pattern 42. The third conductive structures 43 are electrically connected to the upper portions of the second conductive structures 46.

FIGS. 5A to 5D are cross-sectional views illustrating a comparative example of the second embodiment of the present invention.

Figure 5A:
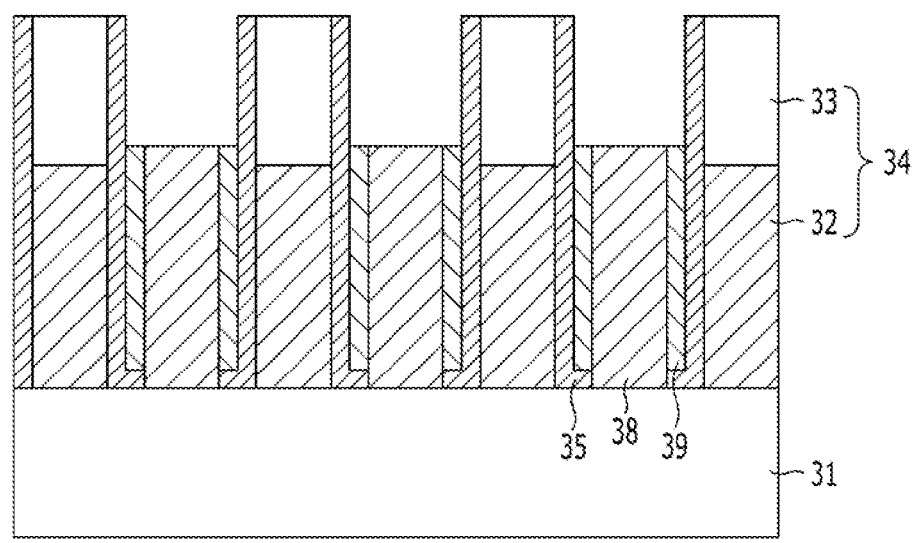
FIGS. 5A to 5D are cross-sectional views illustrating a comparative example of the second embodiment of the present invention.

Referring to FIG. 5A, a plurality of first conductive structures 34 where a first conductive pattern 32 and a hard mask pattern 33 are stacked are formed over a substrate 31.

Subsequently, openings are formed between the first conductive structures 34, and spacers 35 are formed on the sidewalls of the first conductive structures 34.

Subsequently, recessed second conductive pattern 38 and recessed sacrificial spacers 39 are formed.

Figure 5B:
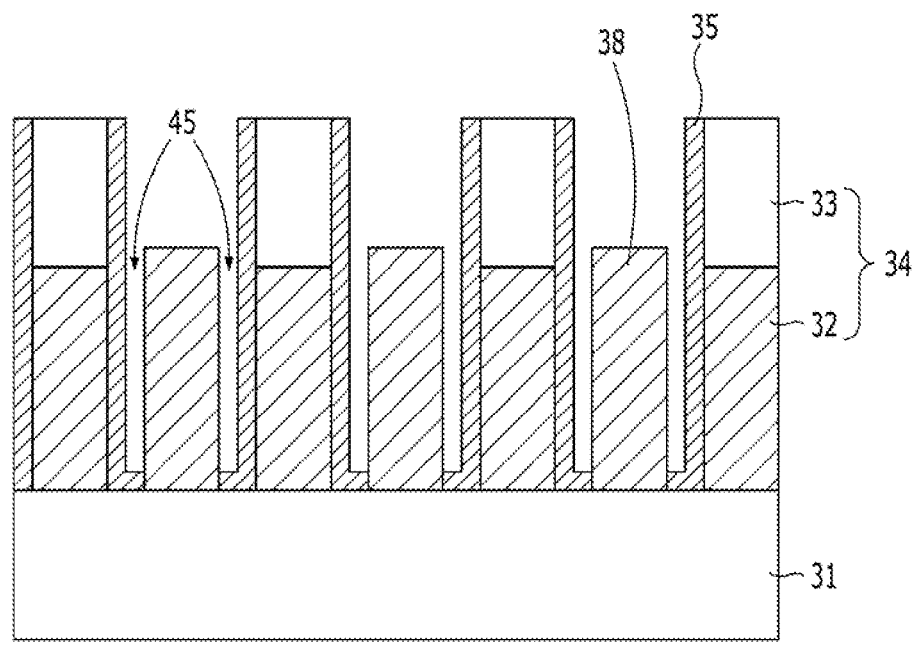

Referring to FIG. 5B, air gaps 45 are formed by removing the sacrificial spacers 39 shown in FIG. 5A.

Figure 5C:
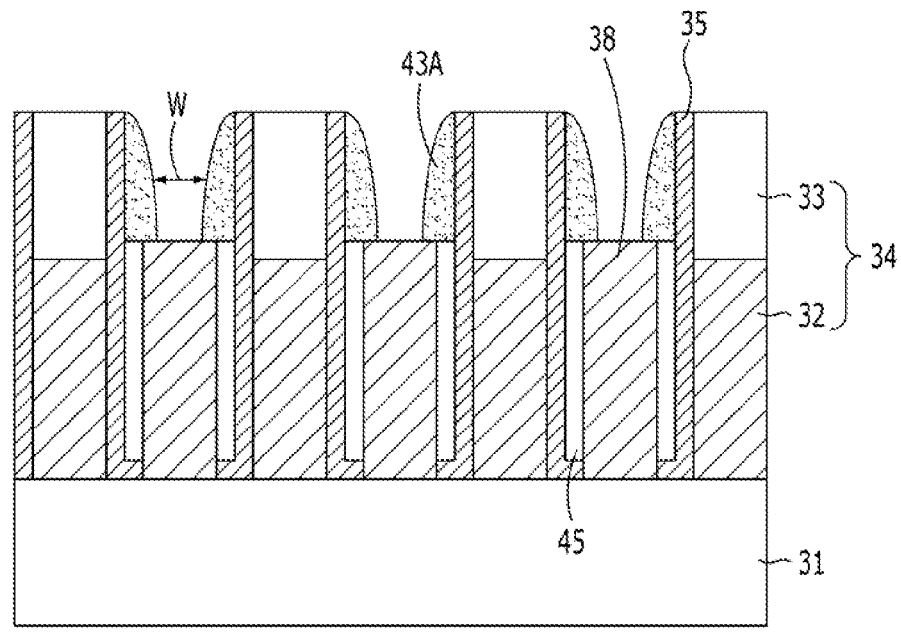
Figure 5D:
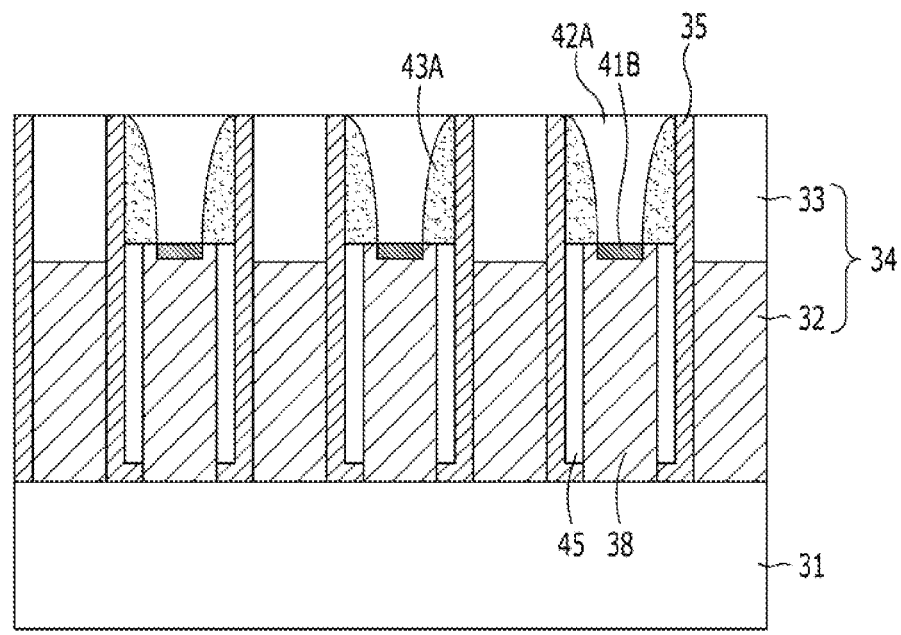

Referring to FIG. 5C, capping spacers 43A for capping the air gaps 45 are formed, Referring to FIG. 5D, a third conductive pattern 41B and a fourth conductive pattern 42A are formed over the second conductive pattern 38.

According to the comparative example, the sacrificial spacers 39 may be formed of silicon oxide, silicon nitride, or titanium nitride. The air gaps 45 are formed by removing the sacrificial spacers 39 through a wet etch process.

According to the comparative example, when the sacrificial spacers 39 are formed of titanium nitride, it is difficult to entirely remove the titanium nitride, causing a Not-Open phenomenon of the air gaps 45. Also, when the titanium nitride is removed, the neighboring structures may be damaged.

Also, according to the comparative example, when the capping spacers 43A are thick to sufficiently cap the air gaps 45, the space (refer to of FIG. 5C) where the fourth conductive pattern 42A is formed and the area where the third conductive pattern 41B is formed become small so that the contact resistance is increased. Since the line width of the second conductive pattern 38 is decreased as much as the space of the air gaps 45 according to the comparative example, the area where the third conductive pattern 41B is formed is decreased.

Additionally, according to the comparative example, when the capping spacers 43A are thin, the air gaps 45 may be open during the formation of the capping spacers 43A. Also, the capping spacers 43A may be lost exposing the air gaps 45 during a stripping process and a cleaning process that are accompanied in the subsequent process of forming the third conductive pattern 41B. As a result, the fourth conductive pattern 42A flows into the air gaps 45 to fill the air gaps 45.

According to the comparative example, resistance is increased due to the volume of the second conductive pattern 38 including a silicon-containing layer being relatively greater than that of the fourth conductive pattern 42A including a metal-containing layer. Therefore, there is a limitation in decreasing the resistance of contact plugs.

As described in the embodiments of the present. invention, the volume of the metal-containing layer is greater than that of a silicon-containing layer. Therefore, the resistance may be decreased. Since the air gaps 45 are formed after the third conductive pattern 41 is formed, the area where the third conductive pattern 41 is formed is increased. Therefore, the contact resistance may be decreased. Moreover, since the stripping process and the cleaning process that are performed after the third conductive pattern 41 is formed, are performed prior to the process of forming the air gaps 45, the loss of the air gaps 45 is minimized. Since the air gaps 45 are capped with the third conductive structures 43 and capping structures 47 shown in FIG. 4K, the air gaps 45 may be capped stably. Also, the fabrication process may be simplified because the formation of capping spacers including a dielectric material is omitted. The fabrication process is even more simplified because the sacrificial spacers 39 are removed in the cleaning process that is performed after the third conductive structures 43 are formed. Since the air gaps 45 are formed after the third conductive structures 43 are formed, the air gaps 45 are not exposed during the etch process of the third conductive structures 43.

Figure 6A:
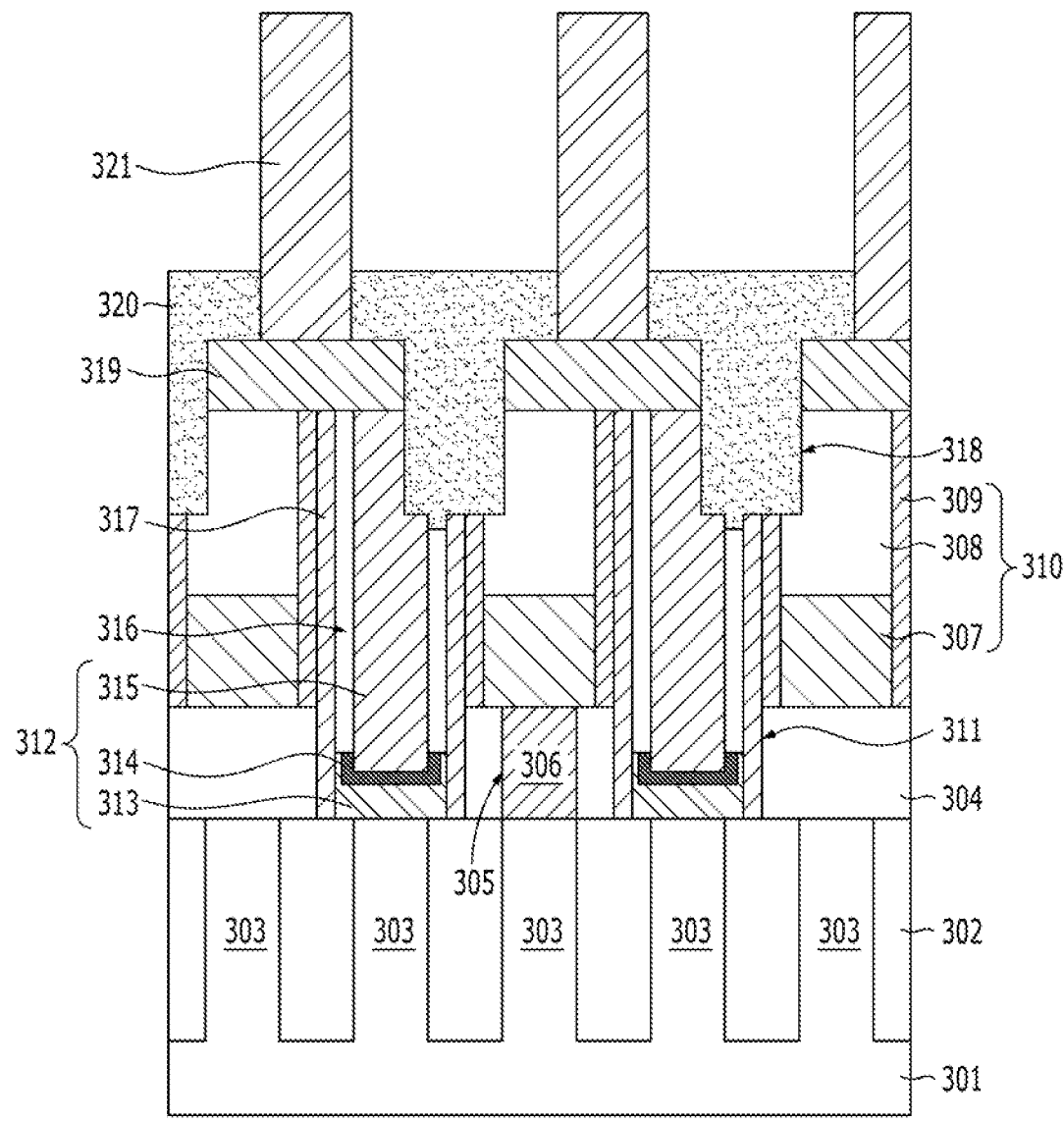
FIG. 6A is a cross-sectional view illustrating a portion of a memory cell.
Figure 6B:
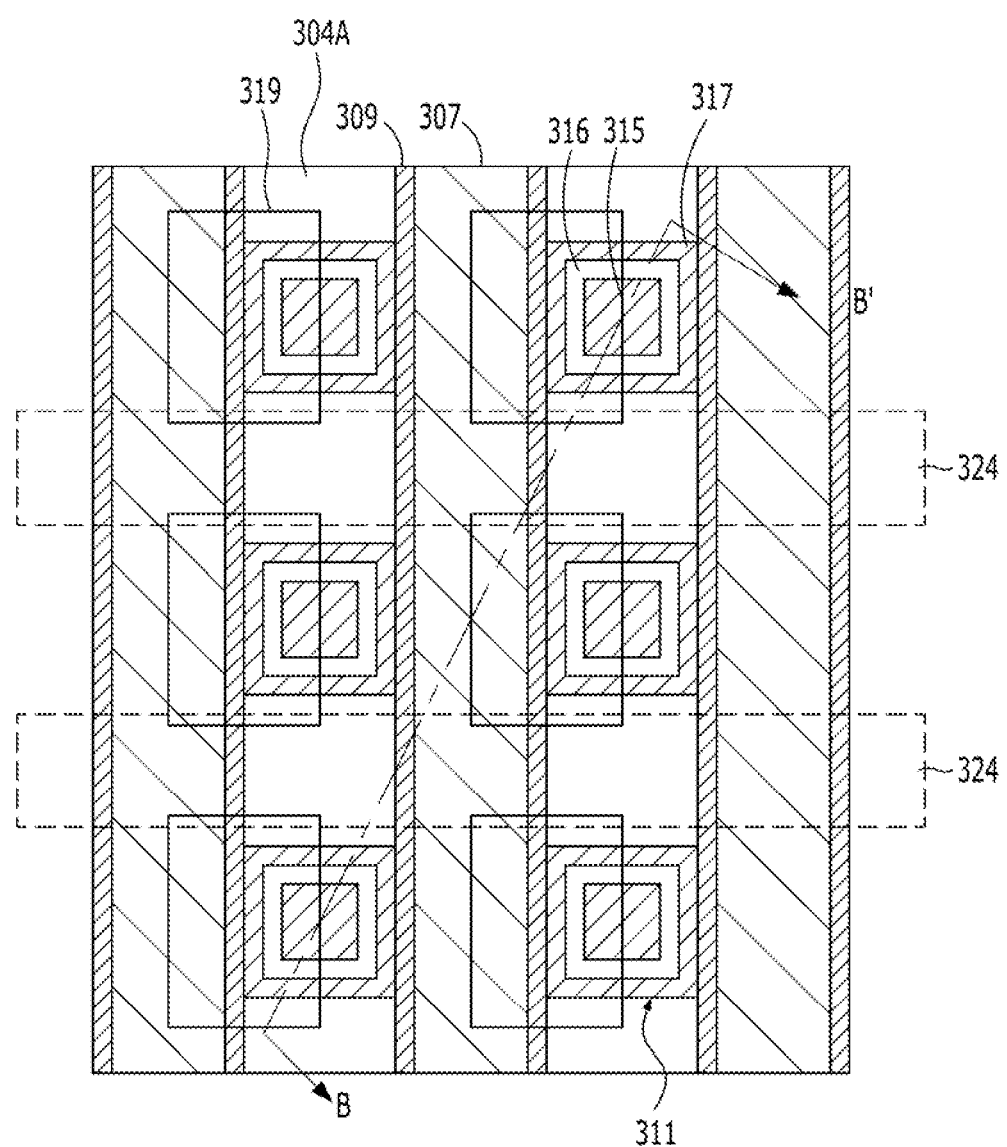
FIG. 6B is a plan view illustrating the memory cell of FIG. 6A.
Figure 6C:
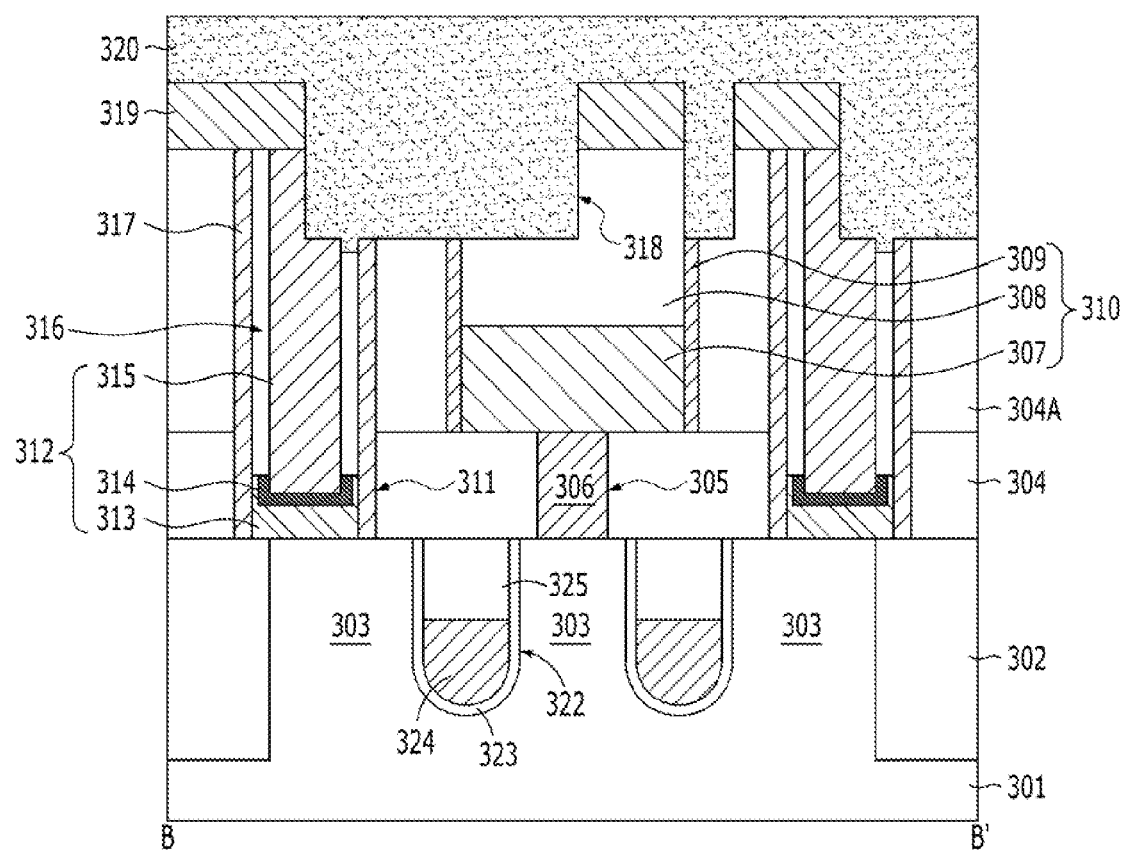
FIG. 6C is a cross-sectional view illustrating the memory cell taken along a line B-B' of FIG. 6B.

FIG. 6A is a cross-sectional view illustrating a portion of a memory cell, FIG. 6B is a plan view illustrating the memory cell of FIG. 6A. FIG. 6C is a cross-sectional view illustrating the memory cell taken along a line B-B' of FIG. 6B. The memory cell shown in FIG. 6A includes a Dynamic Random Access Memory (DRAM) memory cell.

Referring to FIGS. 6A, 6B and 6C, active regions 303 are defined in a substrate 301 by isolation regions 302. Gate trenches 322 traversing the active regions 303 are formed. A gate insulation layer 323 is formed on the surface of the gate trenches 322. Buried gate electrodes 324 partially filling the gate trenches 322 are formed over the gate insulation layer 323. Although not illustrated, a source region and a drain region are formed in the substrate 301. A sealing layer 325 is formed over the buried gate electrodes 324. Bit line structures 310 including bit lines 307 that are stretched in a direction crossing the buried gate electrodes 324 are formed over the substrate 301.

The bit line structures 310 include the bit lines 307, a bit line hard mask 308, and bit line spacers 309. The bit lines 307 are coupled with the active regions 303 through bit line contact plugs 306. The bit line contact plugs 306 are formed in bit line contact holes 305 that are formed in a first inter-layer dielectric layer 304.

Storage node contact plugs are formed to be coupled with the active regions 303. The storage node contact plugs include first contact plugs 312 and second contact plugs 319. The first contact plugs 312 are formed in contact holes 311 to penetrate through the first inter-layer dielectric layer 304 and a second inter-layer dielectric layer 304A. Spacers 317 are formed on the sidewalls of the contact holes 311. Each first contact plug 312 includes a first plug 313, an ohmic contact layer 314, and a second plug 315. The first plug 313 is a silicon plug including polysilicon. The second plug 315 is a metal plug including tungsten. The ohmic contact layer 314 includes a metal silicide. The ohmic contact layer 314 includes a cobalt suicide of "$CoSi_2$ phase." The first contact plugs 312 have a semi-metal plug structure. The first plugs 313 are recessed to have a surface lower than the bottom surface of the bit lines 307. Each second contact plug 319 caps a portion of each air gap 316 and the second plug 315 of each first contact plug 312. The other portion of the air gap 316 is capped with a capping structure 320. The capping structures 320 gap-fill recesses 318.

An insulation structure including the air gap 316 and the spacer 317 is formed between each first contact plug 312 and each bit line 307. The air gap 316 spaces out the second plug 315 from the sidewall of the bit line 307.

A capacitor including a storage node 321 is coupled with the upper portion of each second contact plug 319. The storage node 321 includes a pillar shape. Although not illustrated in the drawing, a dielectric layer and a plate node may be further formed over the storage node 321. The storage node 321 may also have a cylindrical shape other than the pillar shape.

As described above, the memory cell includes the buried gate-type transistor including the buried gate electrodes 324, the bit lines 307, and the capacitor. Each of the first contact plugs 312 is spaced out by the air gap 316 from the sidewall of the bit line 307. The parasitic capacitance between the bit line 307 and the first contact plug 312 is generated between the second plug 315 and the bit line 307. The total resistance of the first contact plug 312 is decreased by the second plug 315 including a metal-containing material. The air gaps 316 decrease the parasitic capacitance between the bit lines 307 and the first contact plugs 312.

FIGS. 7A to 7L are cross-sectional views exemplarily describing a method for fabricating a memory cell.

Figure 7A:
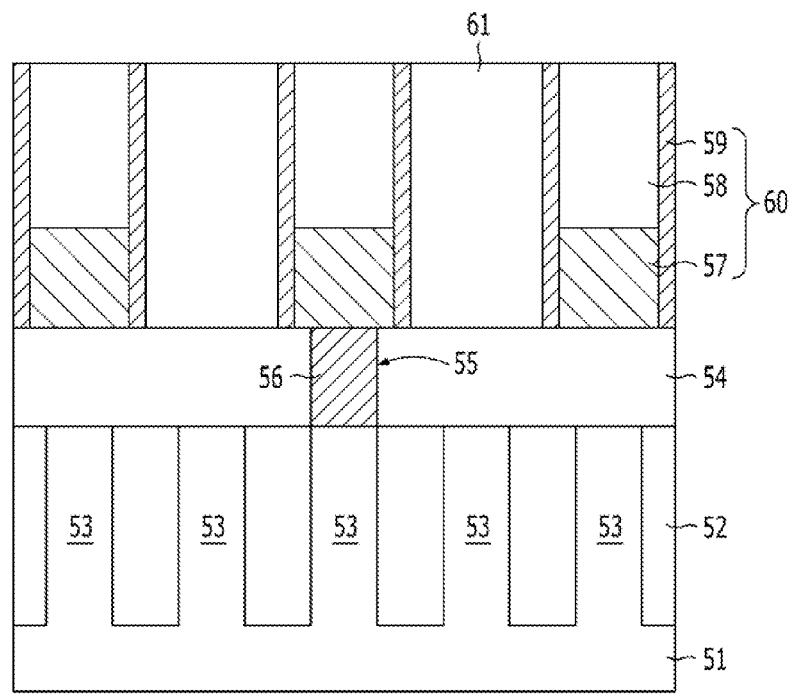
FIGS. 7A to 7L are cross-sectional views exemplarily describing a method for fabricating a memory cell.

Referring to FIG. 7A, a substrate 51 includes silicon. The substrate 51 may include a silicon substrate or a silicon germanium substrate. Also, the substrate 51 may include a Silicon On Insulator (SOI) substrate.

Isolation regions 52 are formed in the substrate 51. The isolation regions 52 may be formed through a Shallow Trench Isolation (STI) process. The isolation regions 52 define active regions 53. The isolation regions 52 may be formed by sequentially forming a wall oxide, a liner, and a gap-fill material. The liner may include a silicon nitride or a silicon oxide. The silicon nitride may include $Si_3N_4$, and the silicon oxide may include $SiO_2$. The gap-fill material may include a silicon oxide such as a Spin-On-Dielectric (SOD) material. Also, the gap-fill material may include a silicon nitride. Herein, the silicon nitride may be the same material of the liner.

Although not illustrated in the drawing, after the isolation regions 52 are formed, buried gate electrodes (refer to '324' of FIG. 6C) may be formed. Hereafter, a method for forming the buried gate electrodes is described with reference to FIG. 6C. After the gate trenches 322 are formed by etching the substrate 301, the buried gate electrodes 324 recessed in the gate trenches 322 are formed. Subsequently, a sealing layer 325 is formed over the buried gate electrodes 324. Before the buried gate electrodes 324 are formed, the gate insulation layer 323 may be formed on the surface of the gate trenches 322. The buried gate electrodes 324 may be formed by forming a metal-containing layer to gap-fill the gate trenches 322 then performing an etch-back process. The metal-containing layer may include a material including a metal as a main component, such as titanium, tantalum, or tungsten. The metal-containing layer may include at least one selected from the group consisting of tantalum nitride (TaN), titanium nitride (TiN), tungsten nitride (WN), and tungsten (W). For example, the buried gate electrodes 324 may include tantalun nitride (TaN), titanium nitride (TiN), or tungsten (W) alone, or the buried gate electrodes 324 may be formed in a double layer structure of TiN/W or TaN/W where tungsten (W) is stacked over titanium nitride (TiN) or tantalum nitride (TaN). Also, the buried gate electrodes 324 may be formed in a double layer structure of WN/W where tungsten (W) is stacked over tungsten nitride (WN). Additionally, the buried gate electrodes 324 may include a metal material having a low resistance. The sealing layer 325 may gap-fill the gate trenches 322 over the buried gate electrodes 324. The sealing layer 325 may also protect the buried gate electrodes 324 from the subsequent process. The sealing layer 325 may include a dielectric material. The sealing layer 325 may include a silicon nitride. After the formation of the sealing layer 325, a source region and a drain region may be formed in each active region 303. As a result, the buried gate-type transistor including the buried gate electrodes 324 is formed.

Referring to FIG. 7A, a first inter-layer dielectric layer 54 is formed over the substrate 51. The first inter-layer dielectric layer 54 may include a silicon oxide or a silicon nitride. The first inter-layer dielectric layer 54 functions as an inter-layer dielectric layer. An etch-stop layer (not shown) including a silicon nitride may be further formed over the first inter-layer dielectric layer 54.

Bit line contact holes 55 are formed by etching the first inter-layer dielectric layer 54. The bit line contact holes 55 may be formed using a mask pattern (not shown) as an etch mask. After the bit line contact holes 55 are formed, the active regions 53 may be recessed to a predetermined depth. As a result, the contact area may be increased between the active region 53 and a bit line contact plug 56 that is formed in each bit line contact hole 55. The active region 53 exposed through each bit line contact hole 55 includes one region between the source region and the drain region of the buried gate-type transistor.

The bit line contact plugs 56 are formed in the bit line contact holes 55. The bit line contact plugs 56 fill the bit e contact holes 55. A conductive layer (not shown) is formed over the substrate structure to gap-fill the bit line contact holes 55 then the conductive layer (not shown) is planarized. As a result, the bit line contact plugs 56 are formed. The bit line contact plugs 56 may include a polysilicon layer or a metal layer.

Bit lines 57 and a bit line hard mask 58 are formed over the bit line contact plugs 56. According to another embodiment of the present invention, the line widths of the bit lines 57 and the bit in line hard mask 58 are set to be shorter than the bit line contact holes 55 so as to etch the bit line contact plugs 56. As the bit line contact plugs 56 are etched, the sidewalls of the bit line contact holes 55 may be exposed again, but the exposed sidewalls of the bit line contact holes 55 may be gap-filled with bit line spacers 59, which are to be formed subsequently. The bit lines 57 include a metal-containing layer containing a metal such as tungsten. The bit line hard mask 58 includes a silicon nitride.

The bit line spacers 59 are formed on the sidewalls of the bit line hard ask 58. The bit line spacers 59 may include a silicon nitride.

As described above, if the bit line spacers 59 are formed, bit line structures 60 including the bit lines 57, the bit line hard mask 58 and the bit line spacers 59 are formed. Although not illustrated in the drawing, when the bit line structures 60 are formed, a gate structure of the transistor may be simultaneously formed in a peripheral circuit region. The gate structure of the transistor formed in the peripheral circuit region may include a buried gate type, a planar gate type, or a recess gate type, A second inter-layer dielectric layer 61 is formed over the bit line structures 60. Subsequently, the second inter-layer dielectric layer 61 may be patterned or planarized to gap-fill the space between the neighboring bit line structures 60.

Figure 7B:
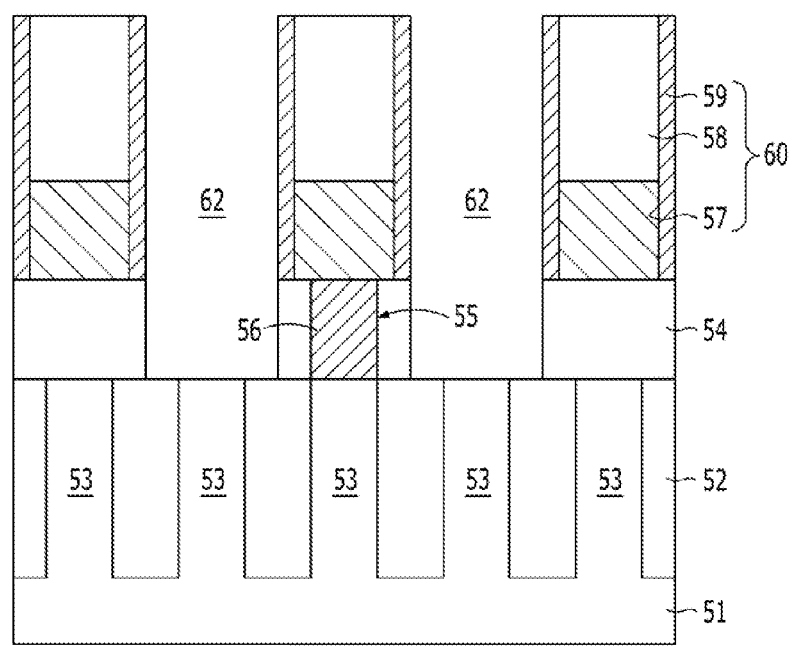

Referring to FIG. 7B, the second inter-layer dielectric layer 61 shown in FIG. 7A and the first inter-layer dielectric layer 54 are etched using the mask pattern (not shown) as an etch mask. As a result, contact holes 62 are formed between the bit line structures 60. The contact holes 62 may be formed to be self-aligned by the bit line structures 60. As a result, the contact holes 62 expose the sidewalls of the neighboring bit line structures 60. Each contact hole 62 exposes a portion of the surface of the substrate 51. Each active region 53 exposed through the contact holes 62 includes one region between the source region and the drain region of the buried gate-type transistor. Although not illustrated in the drawing, the lower portion of each contact hole 62 may be widened by performing a subsequent wet etch process. Herein, a portion of the first inter-layer dielectric layer 54 is etched.

Figure 7C:
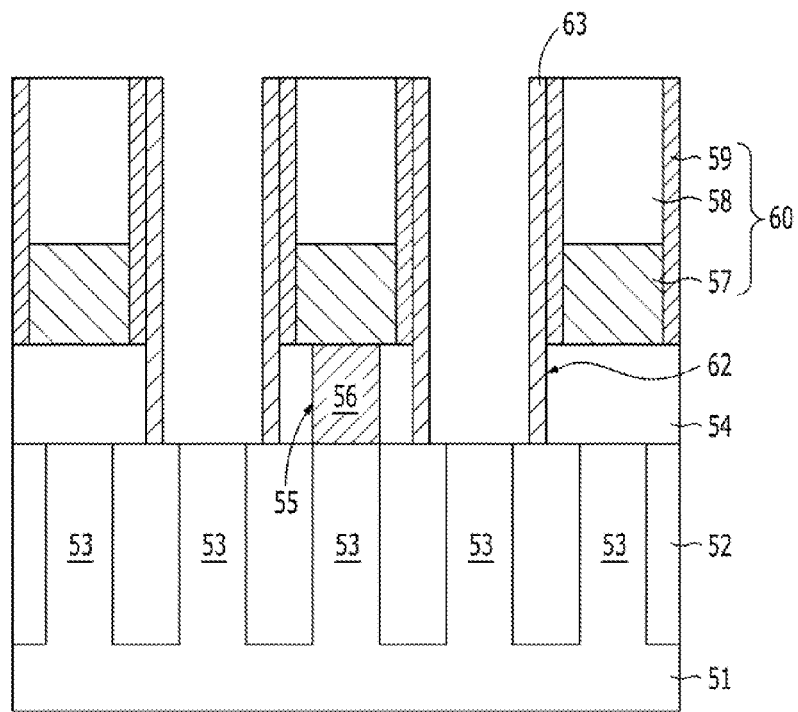

Referring to FIG. 7C, spacers 63 are formed on the sidewalls of the contact holes 62. Specifically, the spacers 63 are formed by forming an insulation layer (not shown) then performing an etch-back process on the insulation layer (not shown). The spacers 63 are formed on the sidewalls of the contact holes 62. As a result of the formation of the spacers 63, the surface of the active regions 53 under the contact holes 62 is exposed. According to another embodiment of the present invention, the formation of the spacers 63 may be omitted.

Figure 7D:
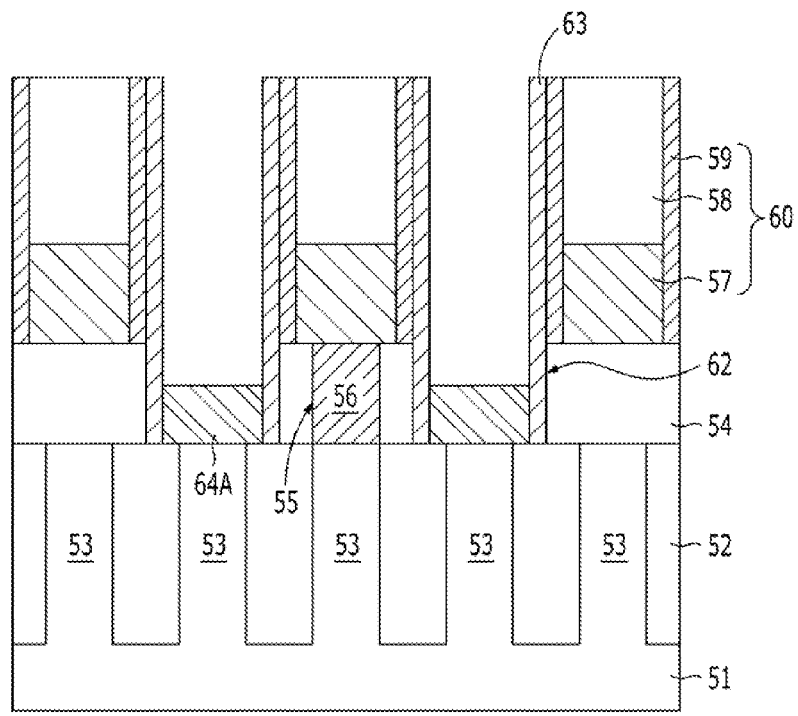

Referring to FIG. 7D, first plugs 64A are formed in the contact holes 62. Each of the first plugs 64A fills a portion of each contact hole 62. That is, the first plugs 64A are formed to be recessed in the contact holes 62. The first plugs 64A are formed by forming a conductive layer (not shown) over the substrate structure to gap-fill the contact holes 62 and recessing the conductive layer. The recessed surface of the first plugs 64A may be controlled to be lower than at least the bottom surface of the bit lines 57. Accordingly, the bit lines 57 and the first plugs 64A do not confront with each other. The first plugs 64A include a silicon-containing layer. The first plugs 64A may include a polysilicon layer. The first plugs 64A may be silicon plugs.

Figure 7E:
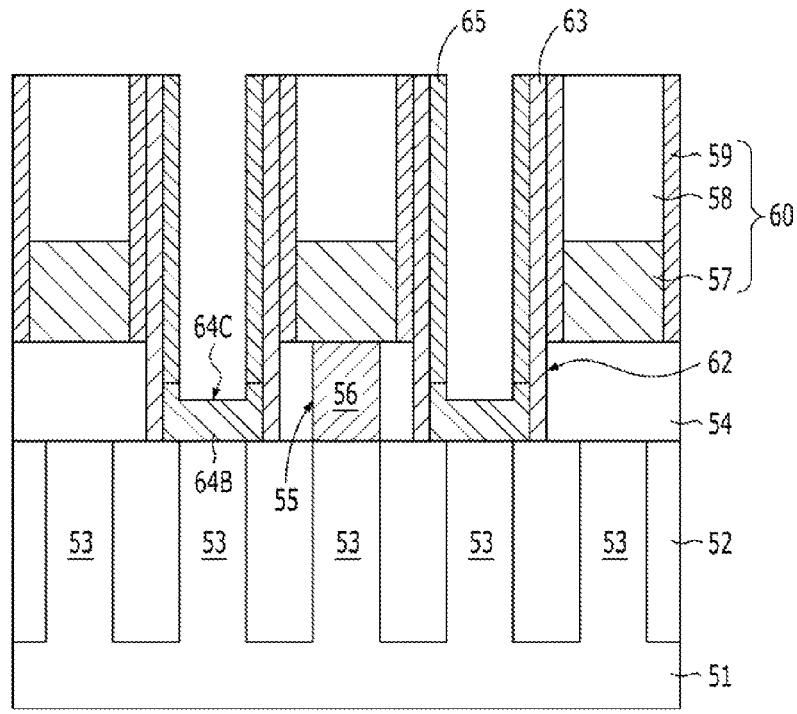

Referring to FIG. 7E, sacrificial spacers 65 are formed on the sidewalls of the contact holes 62 in the upper portion of the first plugs 64A. The sacrificial spacers 65 may be formed by selectively etching a sacrificial layer (not shown). The sacrificial spacers 65 may be formed through a dry etch process. For example, the dry etch process may include an etch-back process. Through the etch process of forming the sacrificial spacers 65, the upper surface of the first plugs 64A is exposed. The sacrificial spacers 65 are removed in the subsequent process to form air gaps. The sacrificial spacers 65 may include a dielectric material, and the sacrificial spacers 65 may include a silicon oxide or a silicon nitride. The sacrificial spacers 65 may be formed by stacking a silicon oxide or a silicon nitride.

When the sacrificial spacers 65 are formed or after the sacrificial spacers 65 are formed, the surface of the first plugs 64A i may be recessed to a predetermined depth (refer to a reference numeral "64C." The recessed first plugs 64A are denoted as "64B." This is to increase the reaction area for forming a silicide layer in the subsequent process.

Figure 7F:
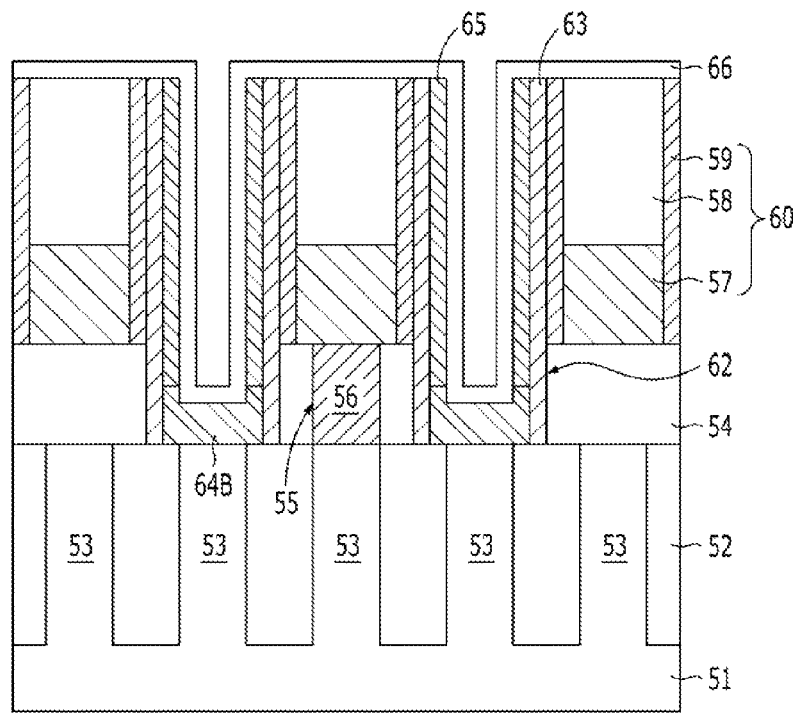

Referring to FIG. 7F, a silicidable layer 66 is formed. The silicidable layer 66 is conformally formed over the substrate structure including the sacrificial spacers 65 and the recessed first plugs 648. The silicidable layer 66 includes a material that forms a metal silicide through a silicidation reaction with the recessed first plugs 64B. The silicidable layer 66 includes a silicidable metal layer. The silicidable metal layer may include a metal-containing layer including a metal atom such as cobalt. When the recessed first plugs 648 include polysilicon, the silicidable layer 66 may include cobalt. The silicidable layer 66 may be deposited through a Physical Vapor Deposition (PVD) process.

When the silicidable layer 66 is formed as described above, the reaction area for forming a silicide is increased between the silicidable layer 66 and the recessed first plugs 64B. For example, the increased reaction area includes a first reaction area based on the recessed surface of the recessed first plugs 64B and a second reaction area based on a protrusion of the recessed first plugs 64B. The increase in the reaction area originates from the increase in the line width of the recessed first plugs 64B.

Although not illustrated in the drawing, a protective layer may be formed over the silicidable layer 66. The protective layer may be conformally formed over the silicidable layer 66. The protective layer protects a silicide layer from being attacked in the subsequent siliciding process. The protective layer includes a metal nitride. The protective layer includes a titanium-containing layer. The protective layer may include a titanium nitride (TIN). The protective layer may be formed by stacking titanium and a titanium nitride (Ti/TiN).

Figure 7G:
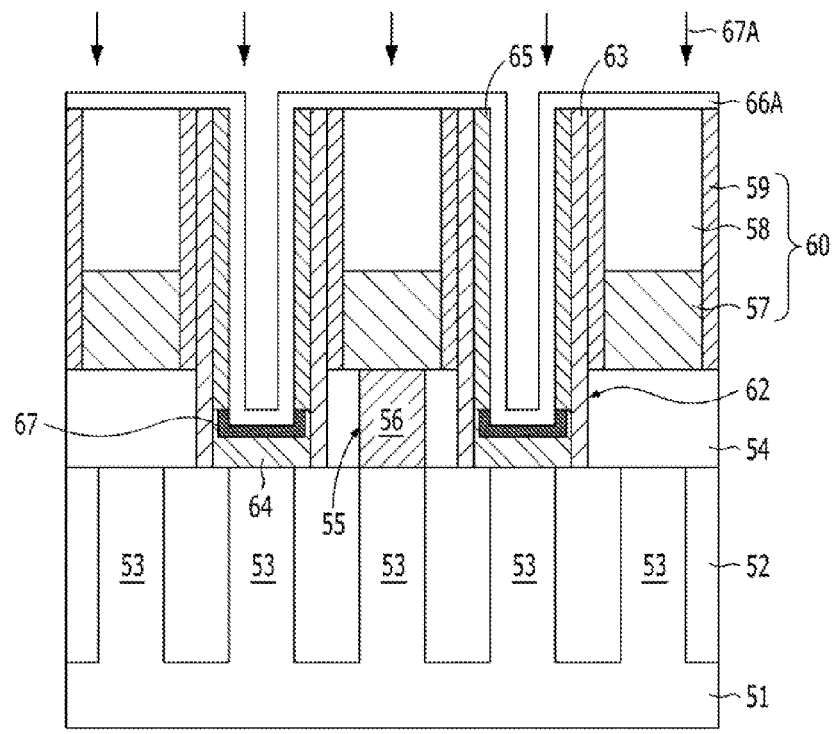

Referring to FIG. 7G, an ohmic contact layer 67 is formed. The ohmic contact layer 67 may be formed through an annealing process 67A. Through the annealing process 67A, the recessed first plugs 64B and the silicidable layer 66 react with each other to form the ohmic contact layer 67. The annealing process 67A causes a silicidation reaction. Specifically, a silicidation reaction occurs on the interface between the recessed first plugs 64B and the silicidable layer 66 to form the ohmic contact layer 67 including a metal silicide layer. The annealing process 67A may be performed at a temperature of approximately 200° C. or higher to cause the silicidation reaction between the silicidable layer 66 and the recessed first plugs 64B. The annealing process 67A includes a Rapid Thermal Annealing (RTA) process. Through the annealing process 67A, a silicon atom of the recessed first plugs 64B and a metal atom of the silicidable layer 66 react with each other to form the ohmic contact layer 67. The ohmic contact layer 67 may include a cobalt silicide. In this embodiment of the present invention, the ohmic contact layer 67 may include a cobalt silicide of "$CoSi_2$ phase." To this end, the annealing process 67A may be performed twice. For example, a primary annealing process may be performed at a temperature of approximately 400° C. to approximately 600° C. As a result of the primary annealing process, a cobalt silicide of "$CoSi_x$ phase" (x=0.1~1.5) is formed. Subsequently, a secondary annealing process is performed. The secondary annealing process includes the Rapid Thermal Annealing (RTA) process. The secondary annealing process may be performed at a higher temperature than that of the primary annealing process. The secondary annealing process may be performed at a temperature of approximately 600° C. to approximately 800° C. The secondary annealing process changes the phase of the ohmic contact layer 67. For example, a cobalt silicide of "CoSi phase" (x=0.1~1.5) is formed as a result of the primary annealing process, and the cobalt silicide of "$CoSi_x$ phase" (x=0.1~1.5) is phase-changed into a cobalt silicide of "$CoSi_2$ phase" through the secondary annealing process. Among cobalt silicides, the cobalt silicide of "$CoSi_2$ phase" has the lowest resistivity.

After the ohmic contact layer 67 is formed, there may be an unreacted silicidable layer 66A remaining. The volume of the recessed first plugs 64B may be reduced as represented by a reference numeral "64."

During the annealing process 67A, since the reaction area of silicon participating in the silicidation reaction is increased due to the recessed surface and protrusion of the recessed first plugs 64B, the cobalt silicide of "$CoSi_2$ phase" having a low resistivity may be formed. When the surface of the first plugs 64A is not recessed, the reaction area of the silicon participating in the silicidation reaction is so insufficient that a cobalt silicide of "$Co_2Si$ phase" having a high resistivity may be formed.

Figure 7H:
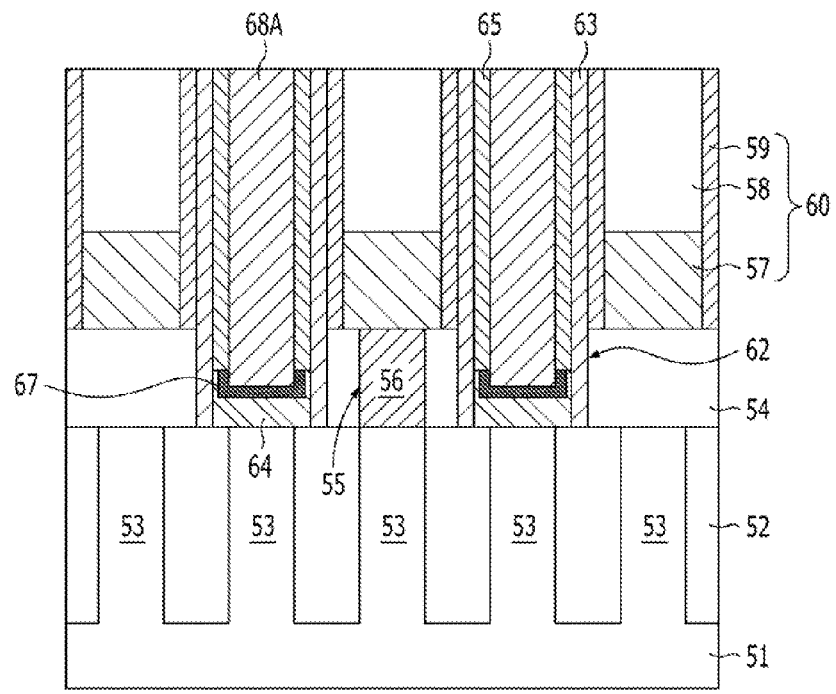

As described above, when the cobalt silicide of "$CoSi_2$ phase" is formed for the ohmic contact layer 67, not only is the contact resistance decreased, but also a low-resistance cobalt silicide may be formed even in the small area of the contact holes 62 having a micro line width Referring to FIG. 7H, the unreacted silicidable layer 66A shown in FIG. 7G is removed.

Subsequently, second plugs 68A are formed over the ohmic contact layer 67. The second plugs 68A may include a metal-containing layer. The second plugs 68A may include a tungsten-containing material. The second plugs 68A may include a tungsten layer or a tungsten compound layer.

The second plugs 68A may be formed in the same height as the surface of the bit line structures 60. The volume of the second plugs 68A is greater than that of the first plugs 64. The second plugs 68A are formed adjacent to the bit lines 57. The first plugs 64 are not adjacent to the bit lines 57.

As described above, when the second plugs 68A are formed, preliminary first contact plugs are formed. The preliminary first contact plugs include the first plugs 64, the ohmic contact layer 67, and the second plugs 68A.

Figure 7I:
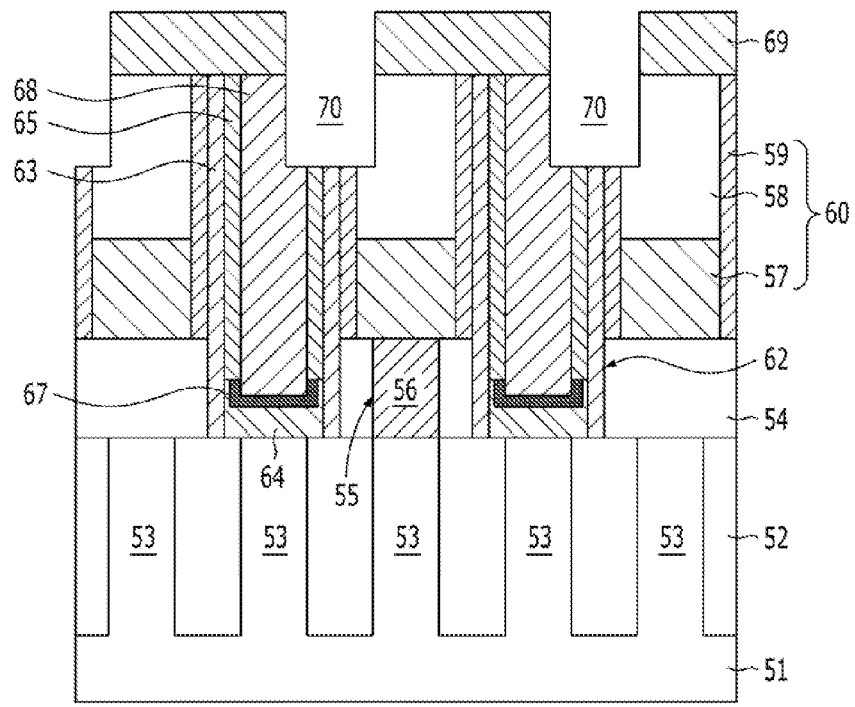

Referring to FIG. 7I, second contact plugs 69 are formed over the second plugs 68A. The second contact plugs 69 include a metal-containing layer. The second contact plugs 69 may include a tungsten-containing material. The second contact plugs 69 may include a tungsten layer or a tungsten compound layer. The second contact plugs 69 are formed by etching the tungsten-containing material. A mask pattern (not shown) may be used to form the second contact plugs 69. The second contact plugs 69 may be simultaneously formed along with metal lines in a peripheral circuit region.

The second contact plugs 69 are a pattern covering a portion of each second plug 68A. Therefore, a portion of the second plug 68A, a portion of the spacer 63, and a portion of the sacrificial spacer 65 are exposed.

Subsequently, recesses 70 are formed. The second plugs 68A exposed between the second contact plugs 69 are etched to a predetermined depth. Herein, a portion of the sacrificial spacer 65, a portion of the spacer 63, and a portion of the bit line hard mask 58 are etched to a predetermined depth. Although not illustrated in the drawing, a portion of the second inter-layer dielectric layer 61 between the bit line structures 60 may be etched.

As described above, the recesses 70 are formed by etching a portion of each second plug 68A of each preliminary first contact plug. As a result, first contact plugs have a stacked structure where the first plugs 64, the ohmic contact layer 67 and the second plugs 68 are stacked.

Figure 7J:
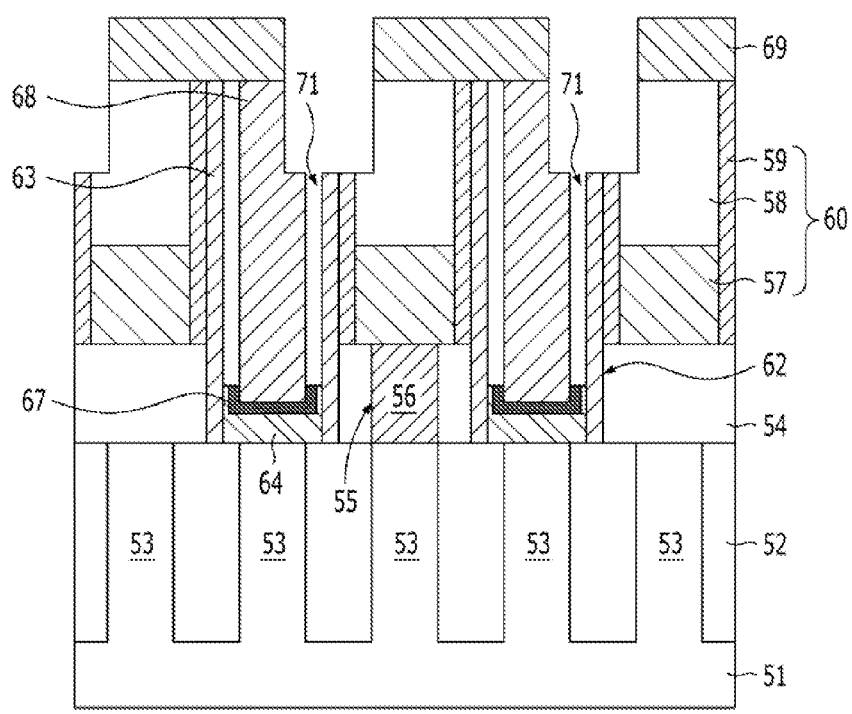

Referring to FIG. 7J, air gaps 71 are formed by removing the sacrificial spacers 65. Each air gap 71 is formed between the sidewall of each second plug 68 and the sidewall of each bit line structure 60. The sacrificial spacers 65 may be removed through a wet etch process. A cleaning process using a wet chemical may be performed to remove the sacrificial spacers 65. The cleaning process may include a post-cleaning process that is performed posterior to an etch process for forming the second contact plugs 69. In this manner, the sacrificial spacers 65 may be removed without an additional process, The sacrificial spacers 65 are removed through the above-described process and the space occupied by the sacrificial spacers 65 remains as the air gaps 71.

The air gaps 71 are formed between the sidewalls of each second plug 68 and the sidewalls of each bit line structure 60. An insulation structure of 'air gap 71-spacer 63' is formed between the sidewalls of the second plug 68 and the sidewalls of the bit line structure 60. The ohmic contact layer 67 is exposed under the air gaps 71, but the first plugs 64 are not exposed.

Since the sacrificial spacers 65 are formed of a silicon oxide and a silicon nitride, the air gaps 71 may be protected from a Not-Open phenomenon and the bit line structures 60 may be prevented from being damaged when the sacrificial spacers 65 are removed.

Also, since the air gaps 71 are formed after the etch process for forming the second contact plugs 69, there is no loss in the air gaps 71.

Figure 7K:
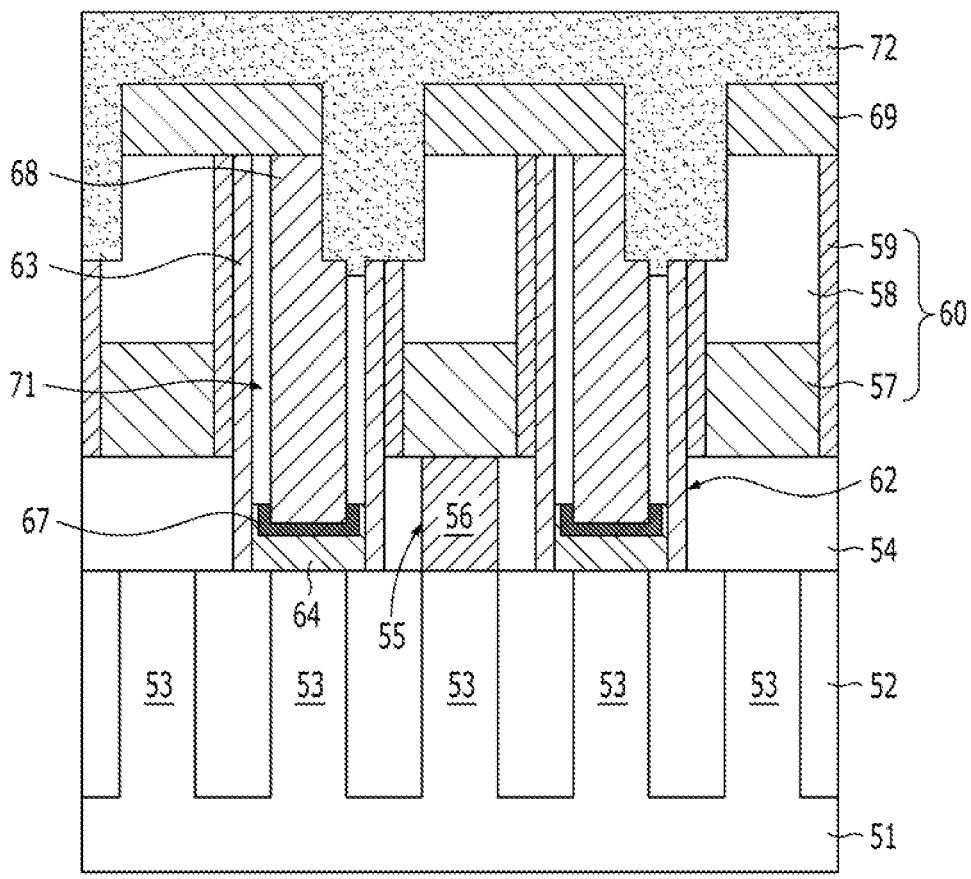

Referring to FIG. 7K a capping layer 72 is formed to cap the second plugs 68 and the air gaps 71. The capping layer 72 includes a dielectric material. The capping layer 72 may include a dielectric material having a low step coverage. For example, the capping layer 72 may be formed through a Plasma Enhanced Chemical Vapor Deposition (PECVD) process, and accordingly, the capping layer 72 may dog the entrances of the air gaps 71. The capping layer 72 includes a silicon oxide layer or a silicon nitride layer. The capping layer 72 may be a silicon nitride layer formed through the PECVD process.

The capping layer 72 gap-fills the recesses 70 while capping the air gaps 71. Additionally, the capping layer 72 covers the upper portions of the second contact plugs 69. The capping layer 72 may be formed by conformally lining a first capping layer then gap-filling a second capping layer. The capping layer 72 may be used as an etch stop layer in the subsequent etch process.

As described above, a portion of each air gap 71 is capped with the second contact plug 69, and the other portion of the air gap 71 is capped with the capping layer 72.

Figure 7L:
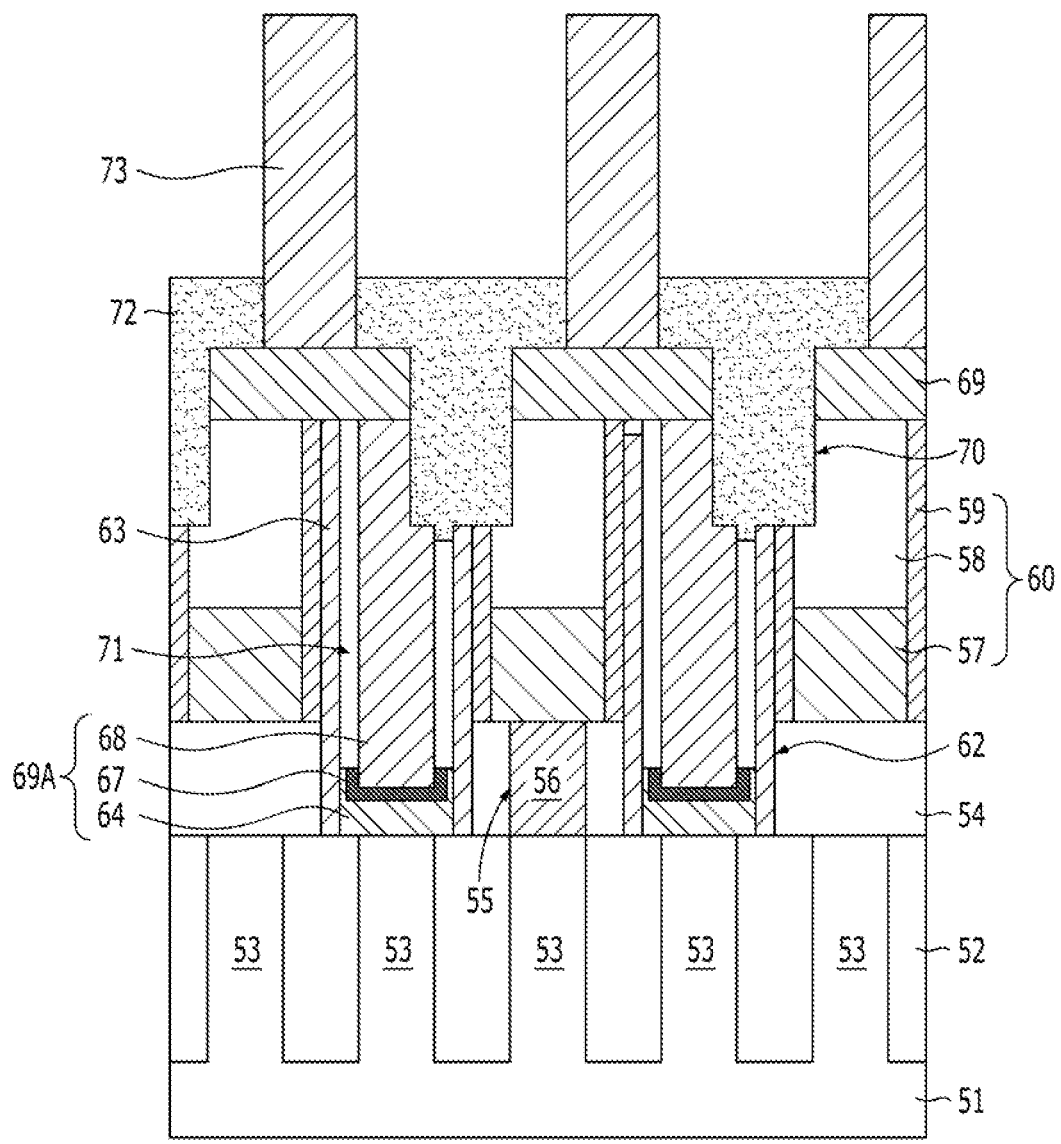

Referring to FIG. 7L, storage nodes 73 are formed over the second contact plugs 69. For example, to form the storage nodes 73, a sacrificial layer (not shown) is formed over the capping layer 72, then openings exposing the second contact plugs 69 are formed by etching the sacrificial layer and the capping layer 72. Subsequently, the storage nodes 73 are formed within the openings, and the sacrificial layer is stripped off. Although not illustrated in the drawing, a dielectric layer and plate nodes may be formed over the storage nodes 73. The storage nodes 73 are of a pillar shape. According to another embodiment of the present invention, the storage nodes 73 may be formed in a cylindrical shape. Since the storage nodes 73 are formed over the second contact plugs 69, overlap margin may be secured.

As described above, the storage node contact plugs formed between the substrate 51 and the storage nodes 73 include first contact plugs 69A and second contact plugs 69. The first contact plugs 69A include the first plugs 64, the ohmic contact layer 67, and the second plugs 68.

The semiconductor device in accordance with the embodiments of the present invention may be applied not only to a Dynamic Random Access Memory (DRAM) device, but also to a Static Random Access Memory (SRAM) device, a flash memory device, a Ferroelectric Random Access Memory (FeRAM) device, a Magnetic Random Access Memory (MRAM) device, a Phase-change Random Access Memory (PRAM) device, and so forth.

Figure 8:
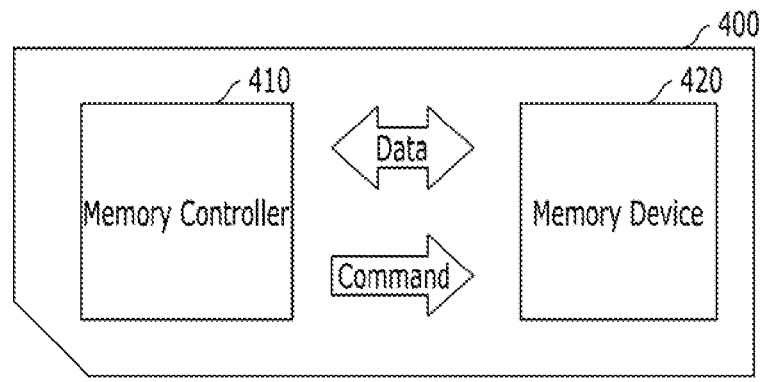
FIG. 8 illustrates a memory card in accordance with an embodiment of the present invention.

FIG. 8 illustrates a memory card.

Referring to FIG. 8, the memory card 400 includes a memory controller 410 and a memory device 420. The memory controller 410 and the memory device 420 may exchange electrical signals with each other. Specifically, the memory controller 410 and the memory device 420 exchange data with each other at the command of the memory controller 410. Accordingly, the memory card 400 stores a data in the memory device 420 or outputs the data from the memory device 420 to the outside. The memory device 420 may include a semiconductor device including air gaps, which are described above. The memory card 400 may be used as a data storage medium for diverse portable devices. For example, the memory card 400 may include a memory stick card, a smart media card (SM), a secure digital card (SD), a mini secure digital card (mini-SD), a multimedia card (MMC) and so forth.

Figure 9:
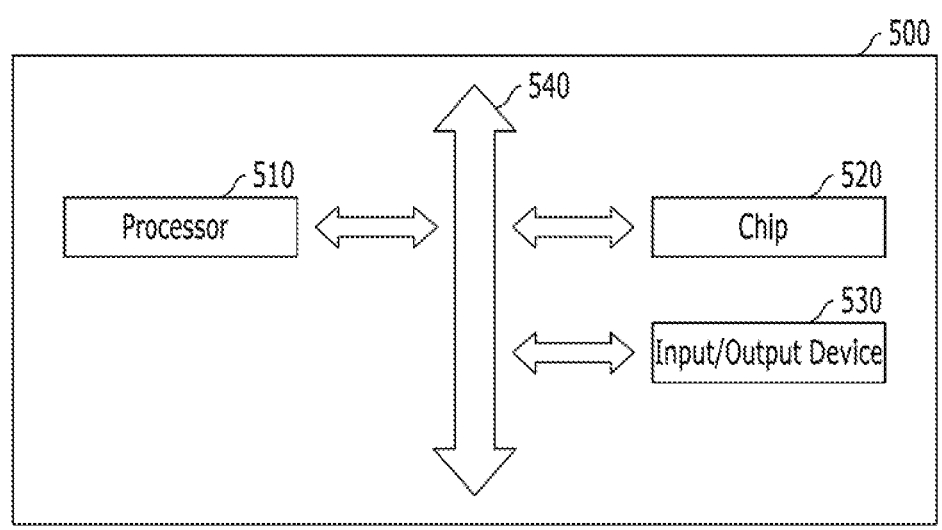
FIG. 9 illustrates an electronic system in accordance with an embodiment of the present invention.

FIG. 9 illustrates an electronic system.

Referring to FIG. 9, the electronic system 500 may include a processor 510, an input/output device 530, and a chip 520. The processor 510, the input/output device 530, and the chip 520 may perform data communication with each other through a bus 540. The processor 510 runs a program, and controls the electronic system 500. The input/output device 530 is used to input or output a data to or from the electronic system 500. The electronic system 500 is connected to an external device, such as a personal computer or a network, and exchanges data with the external device by using the input/output device 530. The chip 520 may store a code or a data for the operation of the processor 510, and process a part of the operation ordered by the processor 510. For example, the chip 520 may include a memory device including a semiconductor device with the air gaps described above. The electronic system 500 may comprise diverse electronic control devices in need of the chip 520. For example, the electronic system 500 may be used for a mobile device, an MP3 player, a navigator, a solid state disk (SSD), household appliances and so on. The electronic system 500 may further include an application chipset, an image signal processor, and/or a modem, The technology of the present invention may decrease both parasitic capacitance and contact resistance by stably capping the air gap.

While the present invention has been described with respect to the specific embodiments, it will be apparent to those skilled in the art that various changes and modifications may be made without departing from the spirit and scope of the invention as defined in the following claims,

What is claimed is:

1. A semiconductor device, comprising:
a plurality of first conductive structures formed over a substrate;
second conductive structures each formed between neighboring first conductive structures;
air gaps each formed between the second conductive structures and the neighboring first conductive structures thereof;
third conductive structures each capping a portion of the air gaps; and
capping structures each capping the other portion of the air gaps.

2. The semiconductor device of claim 1, further comprising:
isolation structures formed between the first conductive structures including one or more openings, wherein the second conductive structures are formed inside the opening over the substrate.

3. The semiconductor device of claim 1, wherein the capping structures include a dielectric material.

4. The semiconductor device of claim 1, wherein the third conductive structures and the capping structures cover the second conductive structures while capping the air gaps.

5. The semiconductor device of claim 1, further comprising:
one or more recesses formed by recessing a portion of the second conductive structures and the third conductive structures,
wherein the capping structures gap-fills the recess.

6. The semiconductor device of claim 1, wherein the second conductive structures and the third conductive structures are plugs.

7. The semiconductor device of claim 1, wherein the second conductive structures are a plug in which a silicon plug, an ohmic contact layer, and a metal plug are stacked, and the air gaps are formed on a sidewall of the metal plug.

8. The semiconductor device of claim 7, wherein the first conductive structures are bit line structure including a bit line.

9. The semiconductor device of claim 8, wherein the silicon plug is recessed to have a surface lower than a bottom surface of the bit line.

10. The semiconductor device of claim 7, wherein a volume of the silicon plug is smaller than a volume of the metal plug.

11. The semiconductor device of claim 7, wherein the ohmic contact layer includes a metal silicide.

12. The semiconductor device of claim 8, further comprising:
a capacitor including a storage node formed over the third conductive structures.

13. The semiconductor device of claim 8, further comprising:
a buried gate-type transistor having a gate electrode buried in the substrate,
wherein the second conductive structures are coupled with the buried gate-type transistor.

14. A semiconductor device, comprising:
an isolation structure formed over a substrate and including one or more openings;
first conductive structures each formed in the opening on the substrate;
air gaps each formed between a sidewall of the first conductive structure and a sidewall of the opening;
second conductive structures each capping a portion of the air gaps; and
capping structures each capping the other portion of the air gaps.

15. The semiconductor device of claim 14, wherein the capping structures include a dielectric material.

16. The semiconductor device of claim 14, wherein the second conductive structures and the capping structures cover the first conductive structures while capping the air gaps.

17. The semiconductor device of claim 14, further comprising:
recesses each self-aligned to an edge of the second conductive structures and formed by recessing a portion of the first conductive structures,
wherein the capping structures gap-fills the recess.

18. The semiconductor device of claim 14, wherein the first conductive structures and the second conductive structures are plugs.

19. The semiconductor device of claim 14, wherein the first conductive structures are a plug in which a silicon-containing layer, an ohmic contact layer, and a metal-containing layer are stacked, and
the air gaps are formed between a sidewall of the metal-containing layer and the sidewall of the openings.

* * * * *